(12) United States Patent
Yao et al.

(10) Patent No.: US 12,062,649 B2
(45) Date of Patent: Aug. 13, 2024

(54) LIGHT-EMITTING MODULE COMPRISING PLURALITY OF LIGHT EMITTING DIODES AND EPITAXIAL REGION AND MANUFACTURING METHOD THEREOF AND DISPLAY DEVICE

(71) Applicant: Shanghai Tianma Microelectronics Co., Ltd., Shanghai (CN)

(72) Inventors: Lu Yao, Shanghai (CN); Wanchun Du, Shanghai (CN); Jine Liu, Shanghai (CN); Xupeng Wang, Shanghai (CN); Feng Qin, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 354 days.

(21) Appl. No.: 17/537,510

(22) Filed: Nov. 30, 2021

(65) Prior Publication Data
US 2022/0085000 A1    Mar. 17, 2022

(30) Foreign Application Priority Data

Jun. 30, 2021   (CN) .......................... 202110739462.5

(51) Int. Cl.
*H01L 25/16*    (2023.01)
*H01L 23/49*    (2006.01)
(Continued)

(52) U.S. Cl.
CPC ...... *H01L 25/167* (2013.01); *H01L 23/49822* (2013.01); *H01L 23/4985* (2013.01); *H01L 23/552* (2013.01)

(58) Field of Classification Search
CPC ............... H01L 25/0753; H01L 25/167; H01L 23/49822; H01L 23/4985; H05B 45/30
(Continued)

(56) References Cited

U.S. PATENT DOCUMENTS

| 11,049,423 B1* | 6/2021 | Wang ..................... G06F 1/1652 |
| 2014/0217382 A1* | 8/2014 | Kwon .................. H10K 77/111 257/40 |

(Continued)

FOREIGN PATENT DOCUMENTS

| CN | 107942563 A | 4/2018 |
| CN | 108052233 A | 5/2018 |

(Continued)

*Primary Examiner* — Didarul A Mazumder
(74) *Attorney, Agent, or Firm* — KILPATRICK TOWNSEND & STOCKTON LLP

(57) ABSTRACT

A light-emitting module includes a light-emitting panel which includes a first rigid substrate, a flexible substrate, a circuit layer, a light-emitting element, and a driver chip. The flexible substrate includes a light-emitting region, a bending region, and an epitaxial region, and the light-emitting region and the epitaxial region are located on two ends of the bending region. The circuit layer includes a first connection terminal located on the epitaxial region and the driver chip is bonded to the first connection terminal. The light-emitting element is located on the light-emitting region, and the light-emitting element emits light toward the first rigid substrate. The flexible substrate is bent in the bending region and the flexible substrate in the epitaxial region is bent to a side of the light-emitting elements facing away from the first rigid substrate. The process difficulty can be reduced and the product yield can be improved.

20 Claims, 15 Drawing Sheets

(51) Int. Cl.
*H01L 23/498* (2006.01)
*H01L 23/552* (2006.01)

(58) Field of Classification Search
USPC ............................ 257/88; 438/22, 24, 46–47
See application file for complete search history.

(56) References Cited

U.S. PATENT DOCUMENTS

| | | | | |
|---|---|---|---|---|
| 2018/0123060 | A1* | 5/2018 | Jang | H10K 77/111 |
| 2019/0339741 | A1* | 11/2019 | Park | H10K 50/125 |
| 2019/0373719 | A1* | 12/2019 | Lee | H10K 59/40 |
| 2020/0161287 | A1* | 5/2020 | Yoo | G09F 9/301 |
| 2020/0249283 | A1* | 8/2020 | Lee | G06F 3/044 |
| 2021/0050534 | A1* | 2/2021 | Yang | H10K 71/00 |
| 2021/0296394 | A1* | 9/2021 | Meng | H01L 27/156 |
| 2021/0357060 | A1* | 11/2021 | Kim | G06F 3/0446 |
| 2021/0366380 | A1* | 11/2021 | Zhu | H01L 25/0753 |
| 2021/0408405 | A1* | 12/2021 | Hu | H10K 77/111 |

FOREIGN PATENT DOCUMENTS

| | | | |
|---|---|---|---|
| CN | 111009564 A | 4/2020 | |
| CN | 111583883 A | 8/2020 | |

\* cited by examiner

LIGHT-EMITTING MODULE COMPRISING PLURALITY OF LIGHT EMITTING DIODES AND EPITAXIAL REGION AND MANUFACTURING METHOD THEREOF AND DISPLAY DEVICE

CROSS-REFERENCE TO RELATED APPLICATION(S)

This application claims priority to Chinese Patent Application No. 202110739462.5 filed Jun. 30, 2021, the disclosure of which is incorporated herein by reference in its entirety.

FIELD

Embodiments of the present disclosure relate to the field of display and in particular to a light-emitting module, a manufacturing method of the light-emitting module, and a display device.

BACKGROUND

Mini-size light-emitting diodes (LEDs) such as micro-light-emitting diodes (microLEDs) or mini-light-emitting diodes (mini-LEDs) have advantages such as lower power consumption, faster response, higher resolution, higher contrast, long lifetime, and the like, receive significant attention in the field of display, and are often used in light-emitting modules in display devices.

A light-emitting module includes a light-emitting element (such as a LED) and a driver circuit and a driver chip which drive the light-emitting element to emit light. In order that the light-emitting module has a narrow frame, the driver chip is typically disposed on the back side of the light-emitting module in the related art, and the driver chip is electrically connected to the driver circuit in a manner of side wiring to control a light-emitting state of the light-emitting element.

However, the process of side wiring is complicated and difficult, which easily leads to a decrease in the yield.

SUMMARY

The present disclosure provides a light-emitting module, a manufacturing method of the light-emitting module, and a display device. The light-emitting module has the advantages of simple process and a high yield.

In some embodiments, the present disclosure provides a light-emitting module which includes at least one light-emitting panel. Each light-emitting panel of the at least one light-emitting panel includes: a first rigid substrate which is a transparent substrate and reused as a cover plate; a flexible substrate which is located on a side of the first rigid substrate and includes a light-emitting region, a bending region, and an epitaxial region, where the light-emitting region and the epitaxial region are located on two ends of the bending region; a circuit layer which is located on a side of the flexible substrate facing away from the first rigid substrate and includes a first connection terminal located on the epitaxial region; light-emitting elements which are located on a side of the circuit layer facing away from the first rigid substrate, is located on the light-emitting region, and are used to emit light toward the first rigid substrate; and a driver chip which is bonded to the first connection terminal.

The flexible substrate is bent in the bending region and the flexible substrate in the epitaxial region is bent to a side, facing away from the first rigid substrate, of the plane where the plurality of light-emitting elements are located.

In some embodiments, the present disclosure further provides a light-emitting module which includes at least one light-emitting panel. Each light-emitting panel of the at least one light-emitting panel includes: a third rigid substrate; a first circuit layer which is located on a side of the third rigid substrate and includes a second connection terminal; light-emitting elements which are located on a side of the first circuit layer facing away from the third rigid substrate; a fourth rigid substrate; a flexible substrate which is located on a side of the fourth rigid substrate and includes a bonding region, a bending region, and an epitaxial region; a second circuit layer which is located on a side of the flexible substrate facing away from the fourth rigid substrate and includes a third connection terminal located on the bonding region and a fourth connection terminal located on the epitaxial region, where the third connection terminal is bonded to the second connection terminal; and a driver chip which is bonded to the fourth connection terminal.

The flexible substrate is bent in the bending region and the flexible substrate in the epitaxial region is bent to a side of the third rigid substrate facing away from the plurality of light-emitting elements.

In some embodiments, the present disclosure further provides a display device which includes the light-emitting module provided in the other embodiments.

In some embodiments, the present disclosure further provides a manufacturing method of the light-emitting module which is applied to the light-emitting module provided in the embodiments. The manufacturing method includes: providing a rigid substrate; coating a flexible material on a side of the rigid substrate to form a flexible substrate, where the flexible substrate includes a light-emitting region, a bending region, and an epitaxial region, and the light-emitting region and the epitaxial region are located on two ends of the bending region; forming a circuit layer on a side of the flexible substrate facing away from the first rigid substrate; transferring a light-emitting element in the light-emitting region; bonding a driver chip to a first connection terminal on the circuit layer; removing a part of the rigid substrate located in the bending region; and bending the flexible substrate in the bending region and bending the flexible substrate of the epitaxial region to a side of the light-emitting element facing away from the first rigid substrate.

According to the light-emitting module provided by the embodiments of the present disclosure, the flexible substrate and the circuit layer are sequentially disposed on the side of the rigid substrate and when the flexible substrate is bent in the bending region to enable the flexible substrate of the epitaxial region to be bent to a non-light-emitting side of the light-emitting element, the circuit layer can be bent at the same time. Thus, the complicated side wiring is not required, the process is simple, and the yield can be improved. Furthermore, since the flexible substrate in the bending region is located on the outer side of the circuit layer of the bending region, the circuit layer can be protected by the flexible substrate and the circuit on the circuit layer can be prevented from being scratched.

DETAILED DESCRIPTION

Figure 1:
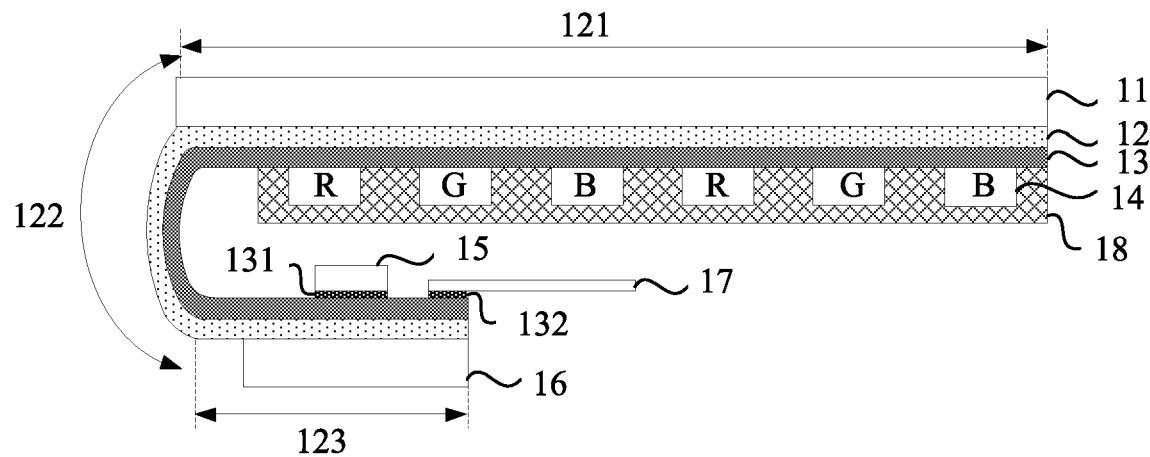
FIG. 1 is a structure diagram of a light-emitting panel according to an embodiment of the present disclosure.

The present disclosure is further described below in detail in conjunction with drawings and embodiments. It is to be understood that the embodiments set forth below are intended to merely illustrate the present disclosure and not to limit the present disclosure. It is to be noted that to facilitate description, merely part, not all, of structures related to the present disclosure are illustrated in the drawings. The shapes and sizes of the elements in the drawings do not reflect their true proportions and are intended merely to schematically illustrate the present disclosure.

In the related art, side wiring typically refers to that wires are formed on a thin film and then the thin film is stuck onto a side of a light-emitting module and one end of a wire is bonded to the front side (display surface) of the light-emitting module by hot pressing and the other end of the wire is bonded to a driver chip through a connection terminal. However, the process of forming the wires on the thin film is very complicated. Moreover, because of the large number of wires, it is difficult to align the wires when the wires are bonded by the hot pressing, which leads to a low product yield.

In order to solve the above problem, the embodiments of the present disclosure provide feasible solutions of two light-emitting modules to replace the side wiring process in the related art, and reducing the process difficulty and improving the product yield.

Terms used in the embodiments of the present disclosure are merely used to describe embodiments and not intended to limit the present disclosure. It is to be noted that spatially related terms, including "on", "below", "left", and "right" used in the embodiments of the present disclosure, are described from the perspective of the drawings and are not to be construed as a limitation to the present disclosure. In addition, in the context, it is to be understood that when an element is formed "on" or "below" another element, the element may not only be directly formed "on" or "below" another element and may also be indirectly formed "on" or "below" another element via an intermediate element. The terms "first", "second", and the like are merely used for description and used to distinguish between different components rather than indicate any order, quantity, or importance. In some embodiments, specific meanings of the preceding terms in the present disclosure may be understood based on specific situations.

Firstly, the first light-emitting module is described below.

FIG. 1 is a structure diagram of a light-emitting panel according to an embodiment of the present disclosure. The embodiment provides a light-emitting module which includes at least one light-emitting panel 100 as shown in FIG. 1. Referring to FIG. 1, the light-emitting panel 100 includes a first rigid substrate 11, a flexible substrate 12 located on a side of the first rigid substrate 11, a circuit layer 13 located on a side of the flexible substrate 12 facing away from the first rigid substrate 11, a light-emitting element 14 located on a side of the circuit layer 13 facing away from the first rigid substrate 11, and a driver chip 15. The first rigid substrate 11 is a transparent substrate and reused as a cover plate. The flexible substrate 12 includes a light-emitting region 121, a bending region 122, and an epitaxial region 123, and the light-emitting region 121 and the epitaxial region 123 are located on two ends of the bending region 122. The circuit layer 13 includes a first connection terminal 131 located on the epitaxial region 123 and the driver chip 15 is bonded to the first connection terminal 131. The light-emitting element 14 is located on the light-emitting region 121 and the light-emitting element 14 emits light toward the first rigid substrate 11. The flexible substrate 12 is bent in the bending region 122 and the flexible substrate 12 in the epitaxial region 123 is bent to a side of the light-emitting element 14 facing away from the first rigid substrate 11.

The circuit layer 13 may include wires. In addition, the circuit layer 13 located in the light-emitting region 121 may also include a driver circuit (not shown in FIG. 1). The circuit layer 13 located in the epitaxial region 123 may also include a first connection terminal 131. The driver circuit is electrically connected to the light-emitting element 14 and the driver chip 15 is bonded to the first connection terminal 131 of the epitaxial region 123 and the driver chip 15 and the driver circuit can be electrically connected to each other by the wires on the circuit layer 13 and the light-emitting state of the light-emitting element 14 is controlled.

In this embodiment, the flexible substrate 12 and the circuit layer 13 are sequentially disposed on the side of the first rigid substrate 11. Thus, when the flexible substrate 12 is bent to enable the flexible substrate 12 of the epitaxial region 123 to be bent to the side of the light-emitting element 14 facing away from the first rigid substrate 11, the circuit layer 13 in the same region can be bent at the same time and it is not necessary to perform the complicated side wiring, the process is simple, and the product yield can be improved. Furthermore, as can be seen from FIG. 1, after the flexible substrate 12 and the circuit layer 13 are bent, the flexible substrate 12 in the bending region 122 is located on an outer side of the circuit layer 13 located in the bending region 122 and the circuit layer 13 can be protected by the flexible substrate 12, the circuit on the circuit layer 13 can be prevented from being scratched, and product reliability can be improved. Exemplarily, the material of the flexible substrate 12 may be polyimide (PI).

In one embodiment, the light-emitting element 14 includes a mini-LED or a micro-LED. The mini-LED or microLED may be transferred onto the circuit layer 13 by the mass transfer technology or the bonding technologies and electrically connected to the driver circuit in the circuit layer 13. The mini-LED or micro-LED is typically encapsulated before being transferred. Therefore, in this embodiment, it is not necessary to add an encapsulation layer and the process can be simplified, and the light and thin design of the light-emitting module is facilitated.

In this embodiment, the first rigid substrate 11 is transparent and can also be used as the cover plate and the light-emitting module is enabled to be thin, which facilitates the light and thin design of the light-emitting module.

According to the light-emitting module provided by the embodiment of the present disclosure, the first rigid substrate is configured to be the transparent substrate and also be used as the cover plate, and the flexible substrate, the circuit layer, and the light-emitting element are sequentially disposed on the side of the first rigid substrate and the circuits and the wires which connect the driver chip and the light-emitting element are all disposed on the circuit layer. Thus, when the flexible substrate is bent in the bending region to enable the flexible substrate of the epitaxial region to be bent to the side of the light-emitting element facing away from the first rigid substrate, the circuit layer can be bent at the same time. In this manner, the complicated side wiring is not required, the process is simple, and the yield can be improved. Furthermore, since the flexible substrate in the bending region is located on the outer side of the circuit layer of the bending region, the circuit layer can be protected by the flexible substrate and the circuit on the circuit layer can be prevented from being scratched and the product reliability is improved. Additionally, the transparent first rigid substrate is also used as the cover plate to further enable the light-emitting module to be light and thin.

With continued reference to FIG. 1, in one embodiment, the light-emitting panel 100 further includes a second rigid substrate 16 which is located on the side, facing away from the light-emitting element 14, of the flexible substrate 12 of the epitaxial region 123.

Specifically, before the flexible substrate 12 is bent, the flexible substrate 12 has a first side in contact with the circuit layer 13 and a second side in contact with the first rigid substrate 11, the second rigid substrate 16 may be located on the same side as the first rigid substrate 11, and the second rigid substrate 16 may be connected to and be in contact with at least a part of the flexible substrate 12 of the epitaxial region 123. In this manner, the second rigid substrate 16 is disposed to support the flexible substrate 12 of the epitaxial region 123 and the circuit layer 13 of the epitaxial region 123 when the driver chip 15 is bonded to the first connection terminal 131. Exemplarily, the flexible substrate 12 and the second rigid substrate 16 may be connected to each other by a bonding force or may be connected and bonded to each other by an adhesive.

In one embodiment, the first rigid substrate 11 and the second rigid substrate 16 is formed by one rigid substrate, and a part, between the first rigid substrate 11 and the second rigid substrate 16, of the one rigid substrate is removed. In this manner, the flexible substrate 12 and the circuit layer 13 can be formed on the same rigid substrate, and then the first rigid substrate 11 and the second rigid substrate 12 can be obtained simply with the rigid substrate of the bending region 122 removed. The process is simpler.

With continued reference to FIG. 1, in one embodiment, the epitaxial region 123 further includes a fifth connection terminal 132 which is electrically connected to the driver chip 15. The light-emitting panel 100 further includes a flexible circuit board 17 which is bonded to the fifth connection terminal 132.

Specifically, the fifth connection terminal 132 and the first connection terminal 131 are connected to each other through a wire on the circuit layer 13. The driver chip 15 is bonded to the first connection terminal 131 to be electrically connected to the fifth connection terminal 132. The flexible circuit board 17 is typically provided with a main control chip and other control circuits. The flexible circuit board 17 is bonded to the fifth connection terminal 132 and the flexible circuit board 17 can be electrically connected to the driver chip 15 to transmit a control signal to the driver chip 15, and enabling the driver chip 15 to control the light-emitting state of the light-emitting element 14 through the driver circuit.

Figure 2:
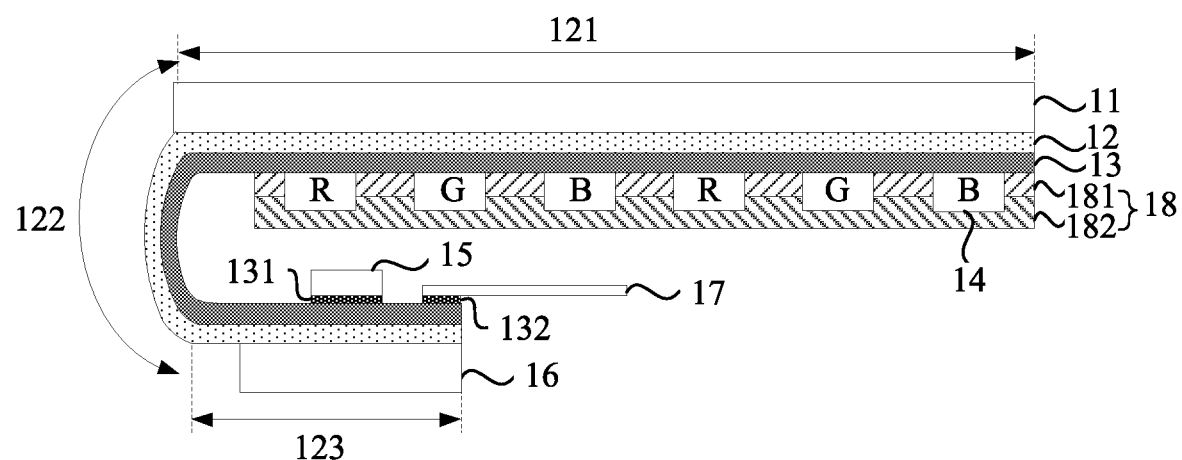
FIG. 2 is a structure diagram of another light-emitting panel according to an embodiment of the present disclosure.

FIG. 2 is a structure diagram of another light-emitting panel according to an embodiment of the present disclosure. Referring to FIG. 2, in one embodiment, the light-emitting panel 100 further includes a light-shielding layer 18, and the light-shielding layer 18 includes a first light-shielding layer 181 which is located between adjacent two light-emitting elements 14.

The first light-shielding layer 181, for example, may be formed before the light-emitting element 14 is transferred. The part of the first light-shielding layer 181 electrically connected to the light-emitting element 14 is exposed and the remaining part is shielded. Since the hot pressing needs to be performed when the light-emitting element 14 is transferred, in this embodiment, the first light-shielding layer 181 is disposed, which is beneficial for shielding the part of the first light-shielding layer 181 which is not electrically connected to the light-emitting element 14 to protect the circuit in the circuit layer 13 from being affected by the high-temperature environment and improve the product yield. In addition, the first light-shielding layer 181 can protect the circuit layer 13 from being scratched in the subsequent process and prevent the circuit layer 13 from being eroded by outside water vapors. Moreover, since the first light-shielding layer 181 is located between the adjacent two light-emitting elements 14, crosstalk between light-emitting elements 14 emitting different colors can be reduced. Exemplarily, the material of the first light-shielding layer 181 may be, for example, black ink.

With continued reference to FIG. 2, in one embodiment, the light-shielding layer 18 further includes a second light-shielding layer 182 located on a side of the first light-shielding layer 181 facing away from the first rigid substrate 11. An orthographic projection of the light-emitting element 14 on the plane where the first rigid substrate 11 is located is within an orthographic projection of the second light-shielding layer 182 on the plane where the first rigid substrate 11 is located.

The second light-shielding layer 182 is disposed and the orthographic projection of the light-emitting element 14 on the plane where the first rigid substrate 11 is located is within the orthographic projection of the second light-shielding layer 182 on the plane where the first rigid substrate 11 is located; thus, the light emitted by the light-emitting element 14 toward the side facing away from the first rigid substrate 11 can be shielded, and the light-emitting element 14 is enabled to emit light toward the first rigid substrate 11. In addition, the light-shielding layer 18 formed by the first light-shielding layer 181 and the second light-shielding layer 182 can completely prevent the crosstalk between the light-emitting elements 14 emitting different colors, improving the contrast. Exemplarily, the material of the second light-shielding layer 182 may be a light-blocking adhesive.

It is to be noted that the structure shown in FIG. 2 is merely an example and not a limitation. In other embodiments, the whole light-shielding layer 18 may be made of the same material and formed in the same process, which is not limited in the embodiment of the present disclosure.

Figure 3:
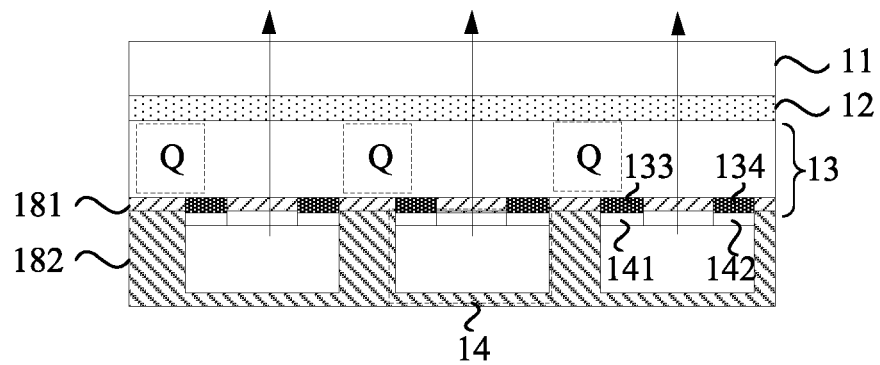
FIG. 3 is a structure diagram of a part of a light-emitting panel according to an embodiment of the present disclosure.

FIG. 3 is a structure diagram of a part of a light-emitting panel according to an embodiment of the present disclosure. Referring to FIG. 3, in one embodiment, the circuit layer 13 includes a driver circuit which includes an anode 133 and a cathode 134; a blank region exists between the anode 133 and the cathode 134; and the light-emitting element 14 includes a first electrode 141 electrically connected to the anode 133 and a second electrode 142 electrically connected to the cathode 134.

The driver circuit may be, for example, a 7T1C (seven transistors and one capacitor) active driver circuit or may be any other type of circuit for driving a LED to emit light, such as a pulse-width modulation (PWM) driver circuit, which is not limited in the embodiment of the present disclosure.

A 7T1C circuit is used as an example. Circuit elements such as a transistor and a capacitor may be formed in the region indicated by Q as shown in FIG. 3 and the blank region can be formed between the anode 133 and the cathode 134 and the circuit elements and the wires are not be disposed in the blank region. In this manner, when the light-emitting element 14 is transferred onto the circuit layer 13, the first electrode 141 of the light-emitting element 14 is electrically connected to the anode 133, the second electrode 142 of the light-emitting element 14 is electrically connected to the cathode 134, and then most of the light emitted by the light-emitting element 14 is emitted from the blank region and the light emitted by the light-emitting element 14 from the blank region can meet the requirement for light transmittance and the display effect is ensured. In addition, on the circuit layer, a blank region may be further disposed around the light-emitting element 14 and the light transmittance of the light-emitting element 14 can be increased and a light utilization rate can be increased.

Figure 4:
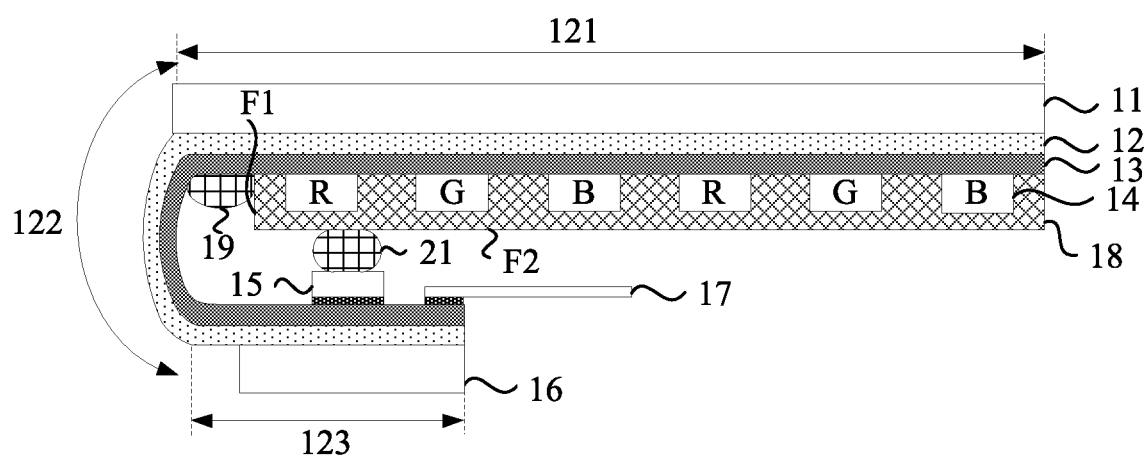
FIG. 4 is a structure diagram of another light-emitting panel according to an embodiment of the present disclosure.

FIG. 4 is a structure diagram of another light-emitting panel according to an embodiment of the present disclosure. Referring to FIG. 4, in one embodiment, the light-shielding layer 18 includes a first side F1 and a first lower side F2, the first lower side is a surface of the light-shielding layer 18 facing away from the first rigid substrate 11; the first side F1 is a surface connected to the first lower side F2 and faces towards the flexible substrate 12 of the bending region 122; and the light-emitting panel 100 further includes a first fixing adhesive 19 which adheres between the flexible substrate 12 of the light-emitting region 121 and the first side F1 of the light-shielding layer 18.

Referring to FIG. 4, in this embodiment, the first fixing adhesive 19 is disposed and is enabled to adhere between the flexible substrate 12 of the light-emitting region 121 and the first side F1 of the light-shielding layer 18. Thus, the first side F1 of the light-shielding layer 18 can be pre-fixed and the light-emitting element 14 closer to the first side F1 of the light-shielding layer 18 is prevented from being deformed by being pulled when the flexible substrate 12 is bent, and improving the yield and reliability of the product. In addition, since the adhesive has a level of fluidity, the surface of the first fixing adhesive 19 will have a curvature after the first fixing adhesive 19 is solidified. Thus, when the flexible substrate 12 is bent, the first fixing adhesive 19 can guide the flexible substrate 12 and the flexible substrate 12 is bent at a large angle of R, and preventing the circuit of the circuit layer 13 from being disconnected due to 180-degree bending of the flexible substrate 12 and improving the yield and reliability of the product.

Figure 5:
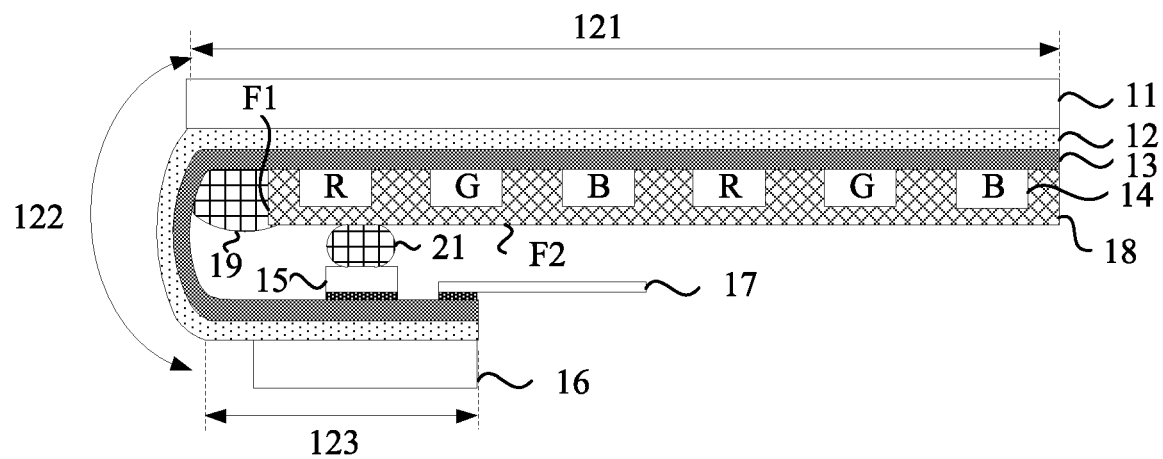
FIG. 5 is a structure diagram of another light-emitting panel according to an embodiment of the present disclosure.

FIG. 5 is a structure diagram of another light-emitting panel according to an embodiment of the present disclosure. Referring to FIG. 5, in one embodiment, the elasticity of the first fixing adhesive 19 is higher than the elasticity of the light-shielding layer 18; and the first fixing adhesive 19 also covers the first side F1 of the light-shielding layer 18 and the connection point of the first side F1 and the first lower side F2 of the light-shielding layer 18.

Specifically, the elastic modulus of the first fixing adhesive 19 is lower than the elastic modulus of the light-shielding layer 18 and the rigidity or hardness of the first fixing adhesive 19 is lower than the rigidity or hardness of the light-shielding layer 18 and the elasticity of the first fixing adhesive 19 is higher than the elasticity of the light-shielding layer 18.

Referring to FIG. 5, the first side F1 of the light-shielding layer 18 and the first lower side F2 of the light-shielding layer 18 form an approximate right angle. Since the distance between the circuit layer 13 of the bending region 122 and the light-shielding layer 18 is short, the right angle may cause damage to the circuit layer 13. In this embodiment, the first fixing adhesive 19 with higher elasticity is used to cover the first side F1 of the light-shielding layer 18 and the connection point of the first side F1 and the first lower side F2 of the light-shielding layer 18 and the circuit layer 13 can be protected from being damaged by the light-shielding layer 18.

Referring to FIG. 4 or FIG. 5, in one embodiment, the light-shielding layer 18 includes the first lower side F2 which is the surface of the light-shielding layer 18 facing away from the first rigid substrate 11; and the light-emitting panel 100 further includes a second fixing adhesive 21 which adheres between the driver chip 15 and the first lower side F2.

When the flexible substrate 12 in the epitaxial region 123 is bent to the side of the light-emitting element 14 facing away from the first rigid substrate 11, the flexible substrate 12 in the epitaxial region 123 may shake if not fixed, and affecting the stability of the structures such as the driver chip 15 and the circuit layer 13. In this embodiment, in order to avoid such a situation, the second fixing adhesive 21 is used to adhere to the driver chip 15 and the first lower side F2 of the light-shielding layer 18 to fix the structures such as the flexible substrate 12 and the circuit layer 13 bent to the back surface of the light-emitting element 14, the driver chip 15, and the like, and improving the product reliability.

Figure 6:
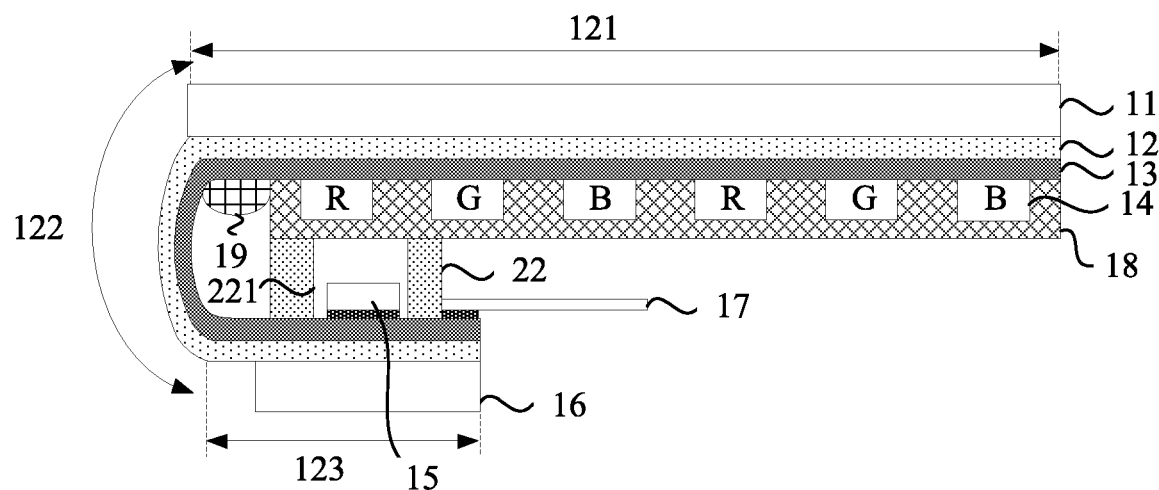
FIG. 6 is a structure diagram of another light-emitting panel according to an embodiment of the present disclosure.

FIG. 6 is a structure diagram of another light-emitting panel according to an embodiment of the present disclosure. Referring to FIG. 6, in one embodiment, the light-emitting panel 100 further includes a buffer layer 22 which is located between the light-emitting element 14 and the flexible substrate 12 of the epitaxial region 123; and an opening 221 is disposed on the buffer layer 22 and the driver chip 15 is located in the opening 221.

In this embodiment, the buffer layer 22 is disposed between the light-emitting element 14 and the flexible substrate 12 of the epitaxial region 123 and the stress which may occur between the driver chip 15 and the light-emitting element 14 can be buffered and any one of the light-emitting element 14 or the driver chip 15 can be prevented from being damaged due to the stress action. In one embodiment, the buffer layer 22 may be coated on the flexible substrate 12 of the epitaxial region 123 after the driver chip 15 and the first connection terminal 131 are bonded to each other. The material of the buffer layer 22 may be, for example, an organic material.

With continued reference to FIG. 6, in one embodiment, the height of the driver chip 15 is less than the depth of the opening 221 of the buffer layer 22 in a direction which is perpendicular to the plane where the first rigid substrate 11 is located.

In this manner, it is possible to avoid contact between the driver chip 15 and the buffer layer 22, and preventing the driver chip 15 from being subjected to the force of the buffer layer 22 and further improving the protection effect for the driver chip 15. It is to be noted that FIG. 6 illustrates an example in which the opening 221 runs through the buffer layer 22. In other embodiments, the opening 221 may not run through the buffer layer 22, that is, the opening 221 is formed in the form of a slot on the buffer layer 22 as long as it is ensured that the height of the driver chip 15 is less than the depth of the opening of the buffer layer 22.

Figure 7:
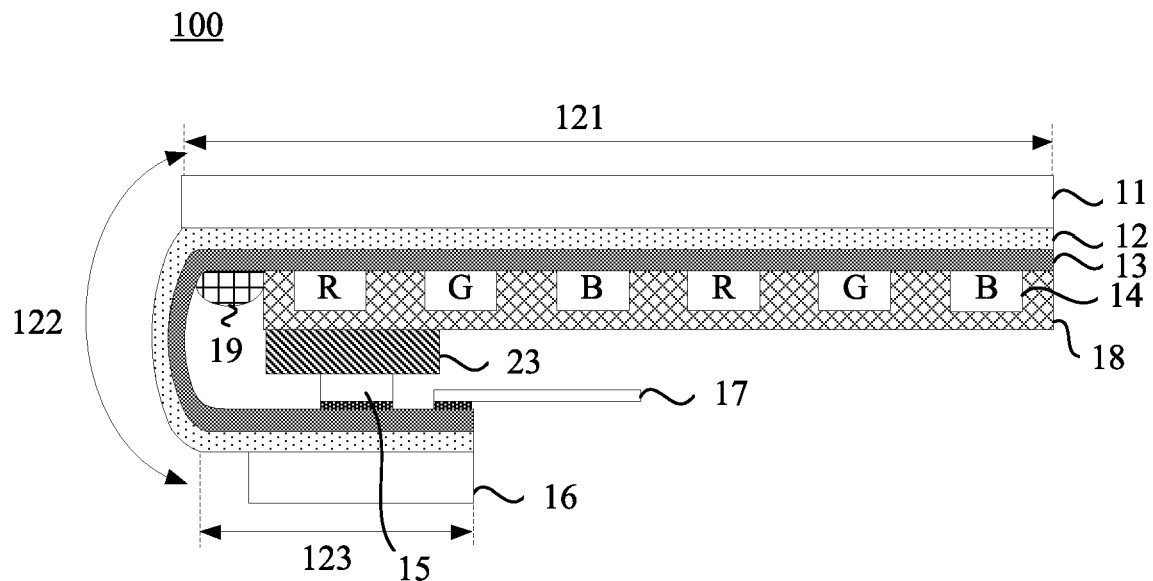
FIG. 7 is a structure diagram of another light-emitting panel according to an embodiment of the present disclosure.

FIG. 7 is a structure diagram of another light-emitting panel according to an embodiment of the present disclosure. Referring to FIG. 7, in one embodiment, the light-emitting panel 100 further includes a black foam 23 which is located between the light-emitting element 14 and the flexible substrate 12 of the epitaxial region 123.

In this manner, the black foam 23 can be enabled to be located between the light-emitting element 14 and the driver chip 15. Since the black foam 23 is made of a soft material and has high elasticity, the stress which may occur between the driver chip 15 and the light-emitting element 14 can be buffered and any one of the light-emitting element 14 or the driver chip 15 can be prevented from being damaged due to the stress action.

Figure 8:
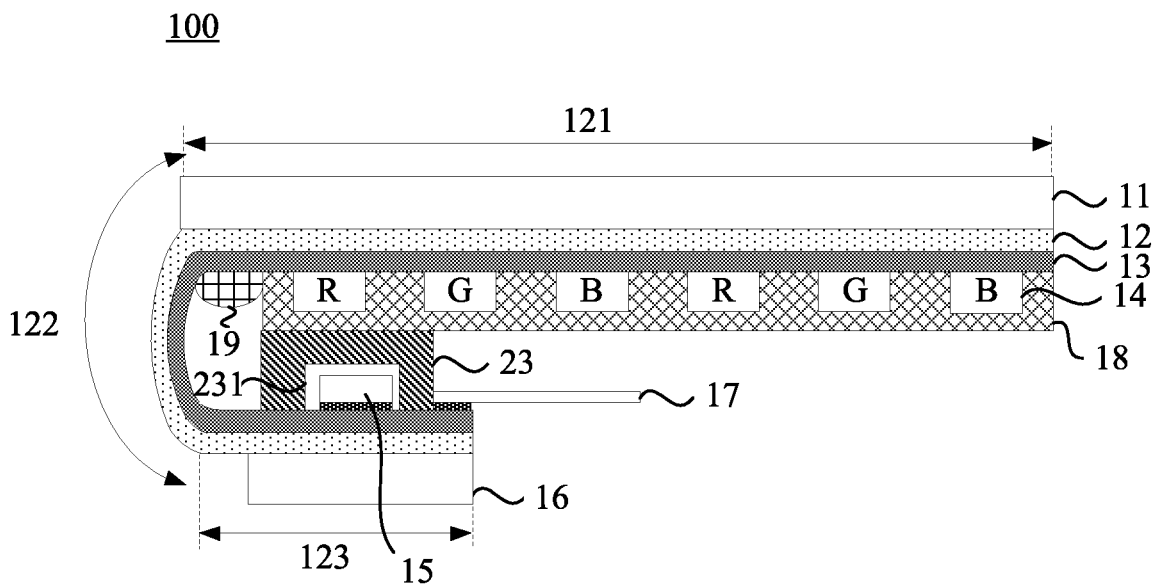
FIG. 8 is a structure diagram of another light-emitting panel according to an embodiment of the present disclosure.

FIG. 8 is a structure diagram of another light-emitting panel according to an embodiment of the present disclosure. Referring to FIG. 8, in one embodiment, the black foam 23 is provided with an opening 231 toward the driver chip 15.

As shown in FIG. 8, the opening 231 is disposed on the black foam 23 and enabled to face towards the driver chip 15 and the driver chip 231 can be located in the opening 231 of the black foam 23, and improving the flatness of the internal structure of the light-emitting module.

With continued reference to FIG. 8, in one embodiment, the height of the driver chip 15 is less than the depth of the opening of the black foam 23 in the direction which is perpendicular to the plane where the first rigid substrate 11 is located.

As mentioned above, in this manner, it is possible to avoid contact between the driver chip 15 and the black foam 23, and preventing the driver chip 15 from being subjected to the force of the black foam 23 and further improving the protection effect for the driver chip 15. It is to be noted that the opening 231 on the black foam 23 may or may not run through the black foam 23. FIG. 8 illustrates merely an example in which the opening 231 on the black foam 23 does not run through the black foam 23.

Figure 9:
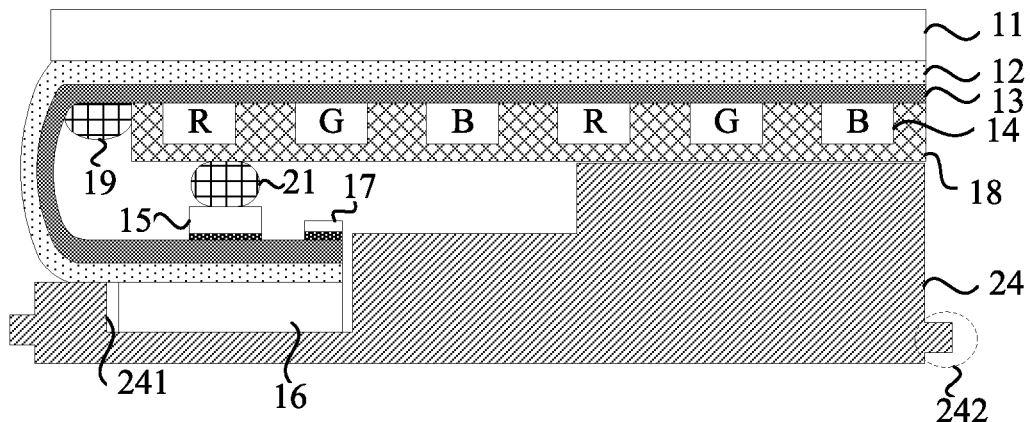
FIG. 9 is a structure diagram of another light-emitting panel according to an embodiment of the present disclosure.

FIG. 9 is a structure diagram of another light-emitting panel according to an embodiment of the present disclosure. Referring to FIG. 9, in one embodiment, the light-emitting panel 100 further includes a carrier board 24 which is located on a side of the second rigid substrate 16 facing away from the flexible substrate 12; and the carrier board 24 is provided with a slot 241 and the second rigid substrate 16 is located in the slot 241.

The carrier board 24 is disposed on the side of the second rigid substrate 16 facing away from the flexible substrate 12 and is to carry the above-mentioned structures such as the light-emitting element 14 and the first rigid substrate 11 on which the light-emitting element 14 is located, the driver chip 15 and the second rigid substrate 16 on which the driver chip 15 is located, and the flexible circuit board 17. The carrier board 24 is provided with the slot 241 and the second rigid substrate 16 is located in the slot 241, which facilitates the light and thin design of the light-emitting panel. In addition, the carrier board 24 may be provided with a protrusion 242. When the light-emitting module is assembled into the housing of the display device, the protrusion 242 can be inserted into the engagement hole of the housing to fix the light-emitting module.

Figure 10:
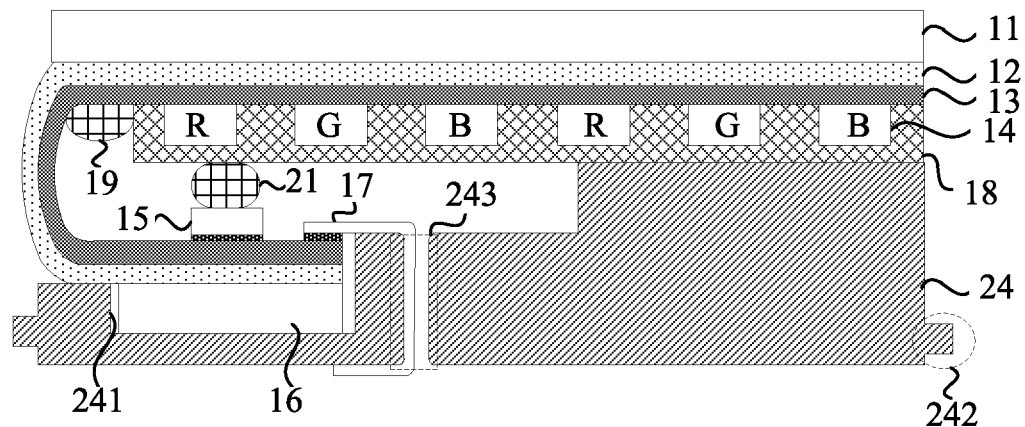
FIG. 10 is a structure diagram of another light-emitting panel according to an embodiment of the present disclosure.

It is to be noted that in the structure shown in FIG. 9, the flexible circuit board 17 passes through the slot 241 of the carrier board 24 and is electrically connected to an external circuit. However, the embodiment of the present application is not limited to this. In other embodiments, referring to FIG. 10 which is a structure diagram of another light-emitting panel according to an embodiment of the present disclosure. In one embodiment, the carrier board 24 is provided with a through hole 243 and the flexible circuit board 17 can pass through the through hole 243 and be electrically connected to the external circuit. In this case, the carrier board 24 can protect the flexible circuit board 17 from being scratched.

Figure 11:
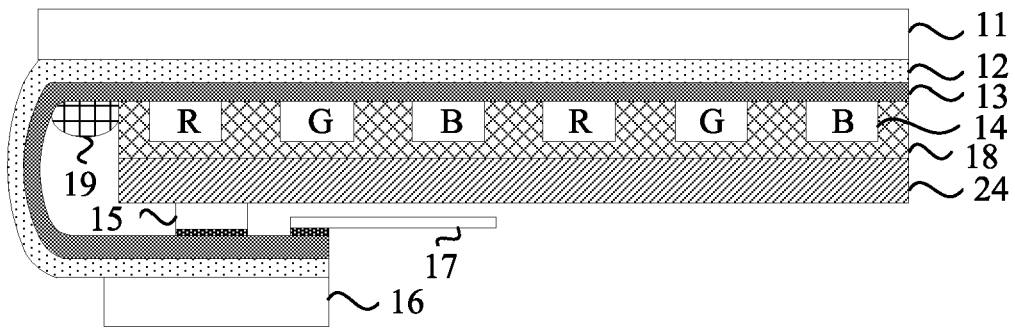
FIG. 11 is a structure diagram of another light-emitting panel according to an embodiment of the present disclosure.

The structure of the carrier board 24 in FIG. 9 is merely an example and not a limitation. Exemplarily, FIG. 11 is a structure diagram of another light-emitting panel according to an embodiment of the present disclosure. Referring to FIG. 11, in one embodiment, the light-emitting panel 100 further includes a carrier board 24 which is located between the light-shielding layer 18 and the driver chip 15; and in addition, the driver chip 15 and the light-shielding layer 18 adhere onto two opposite sides of the carrier board 24.

In this embodiment, since a gap exists between the light-shielding layer 18 and the driver chip 15, the carrier board 24 is disposed in the gap and the driver chip 15 and the light-shielding layer 18 adhere to two opposite sides of the carrier board 24. In this manner, the structures such as the light-emitting element 14 and the first rigid substrate 11 on which the light-emitting element 14 is located, the driver chip 15 and the second rigid substrate 16 on which the driver chip 15 is located, and the flexible circuit board 17 can also be carried and fixed, and the light and thin design of the light-emitting panel is facilitated.

Moreover, as can be seen from FIGS. 4-11, the first fixing adhesive 19 is configured to adhere between the flexible substrate 12 of the light-emitting region 12 and the first side F1 of the light-shielding layer 18. Specifically, in FIGS. 4 and 6-11, the first fixing adhesive 19 is configured to cover part of the first side F1; and in FIG. 5, the first fixing adhesive 19 is configured to cover the whole first side F1 and the connection point of the first side F1 and the first lower side F2.

In summary, the above-mentioned embodiment describes in detail one of the structures of the light-emitting panel in the light-emitting module. The second structure of the light-emitting module is described below.

Figure 12:
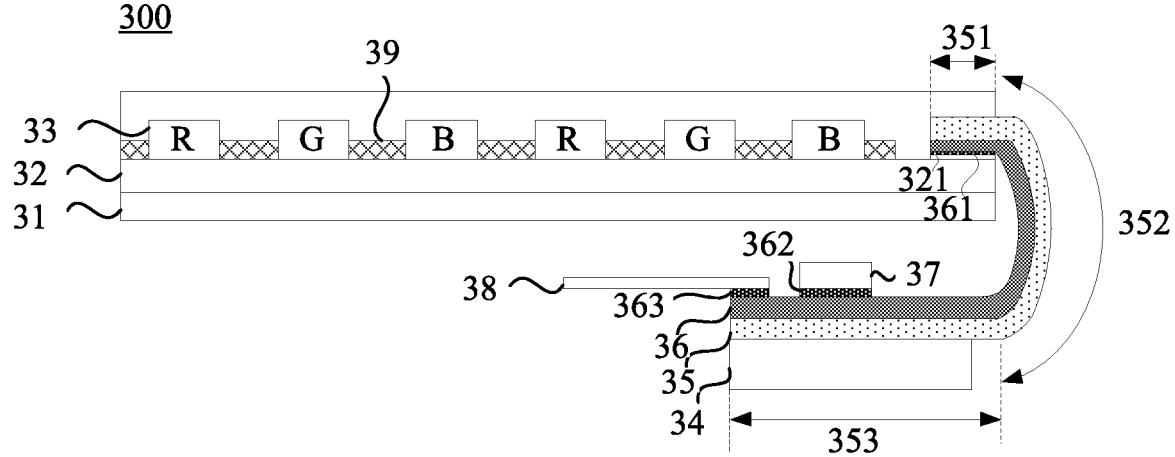
FIG. 12 is a structure diagram of another light-emitting panel according to an embodiment of the present disclosure.

FIG. 12 is a structure diagram of another light-emitting panel according to an embodiment of the present disclosure. The embodiment provides another light-emitting module which includes at least one light-emitting panel 300 as shown in FIG. 12. Referring to FIG. 12, the light-emitting panel 300 includes a third rigid substrate 31, a first circuit layer 32 located on a side of the third rigid substrate 31, a light-emitting element 33 located on a side of the first circuit layer 32 facing away from the third rigid substrate 31, a fourth rigid substrate 34, a flexible substrate 35 located on a side of the fourth rigid substrate 34, a second circuit layer 36 located on a side of the flexible substrate 35 facing away from the fourth rigid substrate 34, and a driver chip 37. The first circuit layer 32 includes a second connection terminal 321. The flexible substrate 35 includes a bonding region 351, a bending region 352, and an epitaxial region 353. The second circuit layer 36 includes a third connection terminal 361 located in the bonding region 351 and a fourth connection terminal 362 located in the epitaxial region 353. The third connection terminal 361 is bonded to the second connection terminal 321. The driver chip 37 is bonded to the fourth connection terminal 362. The flexible substrate 35 is bent in the bending region 352 to enable the flexible substrate 35 of the epitaxial region 353 to be bent to the side of the third rigid substrate 31 facing away from the light-emitting element 33.

In this embodiment, the third rigid substrate 31 may be cut from a large-sized rigid substrate, and the first circuit layer 32 and the light-emitting element 33 are sequentially formed on the third rigid substrate 31. The first circuit layer 32 includes a driver circuit (not shown in FIG. 12) located in the region where the light-emitting element 33 is located and wires which extend to the bonding region 351. The wires are electrically connected to the second connection terminal 321.

In this embodiment, the fourth rigid substrate 34 may be cut from another large-sized rigid substrate with a part of the rigid substrate removed and is used to provide support for the flexible substrate 35 of the epitaxial region 353 and the second circuit layer 36. The flexible substrate 35 and the second circuit layer 36 are sequentially formed on the fourth rigid substrate 34. The second circuit layer 36 is provided with wires which are respectively connected to the third connection terminal 361 and the fourth connection terminal 362. Thus, the third connection terminal 361 is bonded to the second connection terminal 321 and the driver chip 37 is bonded to the fourth connection terminal 362 and the driver chip 37 can be electrically connected to the driver circuit, and controlling the light-emitting state of the light-emitting element 33.

In this embodiment, a solution that the second connection terminal 321 and the third connection terminal 361 are bonded to each other is adopted. Since the size of the connection terminal is larger than the size of the wire, it is less difficult to perform alignment and it is no need to manufacture side wires in the above-mentioned solution compared with the side wiring solution in the related art. Thus, the process is simpler and the product yield can be improved.

Specifically, regarding the manufacturing process, after the third connection terminal 361 and the second connection terminal 321 are bonded to each other and the driver chip 37 and the fourth connection terminal 362 are bonded to each other, the flexible substrate 35 may be bent to enable the flexible substrate 35 of the epitaxial region 353 to be bent to the side of the third rigid substrate 31 facing away from the light-emitting element 33. As shown in FIG. 12, since the flexible substrate 35 in the bending region 352 is located on an outer side of the second circuit layer 36, the second circuit layer 36 can be protected by the flexible substrate 35, the circuit on the second circuit layer 36 can be prevented from being scratched, and the product reliability can be improved. Exemplarily, the material of the flexible substrate 35 may be polyimide (PI).

In one embodiment, the light-emitting element 33 includes the mini-LED or the microLED. The mini-LED or the microLED may be transferred onto the first circuit layer 32 by the mass transfer technology or the bonding technologies and electrically connected to the driver circuit in the first circuit layer 32.

According to the light-emitting module provided by this embodiment, the first circuit layer on the third rigid substrate is configured to include the second connection terminal, and the second circuit layer on the fourth rigid substrate is configured to include the third connection terminal located in the bonding region and the fourth connection terminal located in the epitaxial region. Then, the third connection terminal and the second connection terminal are bonded to each other, the driver chip and the fourth connection terminal are bonded to each other and the flexible substrate is bent to enable the flexible substrate of the epitaxial region to be bent to the side of the third rigid substrate facing away from the light-emitting element. Such solution can replace the side wiring solution in the related art to reduce the process difficulty and improve the product yield.

With continued reference to FIG. 12, in one embodiment, the epitaxial region 353 further includes a fifth connection terminal 363 which is electrically connected to the driver chip 37. The light-emitting panel 300 further includes a flexible circuit board 38 which is bonded to the fifth connection terminal 363.

Specifically, the fifth connection terminal 363 and the fourth connection terminal 362 are connected to each other through a wire on the second circuit layer 36. The driver chip 37 is bonded to the fourth connection terminal 362 and thus is electrically connected to the fifth connection terminal 363. The flexible circuit board 38 is typically provided with a main control chip and other control circuits. The flexible circuit board 38 is bonded to the fifth connection terminal 363 and the flexible circuit board 38 can be electrically connected to the driver chip 37 to transmit a control signal to the driver chip 37, and enabling the driver chip 37 to control the light-emitting state of the light-emitting element 33 by the driver circuit.

With continued reference to FIG. 12, in one embodiment, the light-emitting panel 300 further includes a third light-shielding layer 39 which is located between adjacent two light-emitting elements 33.

The third light-shielding layer 39, for example, may be formed before the light-emitting element 33 is transferred. The part of the third light-shielding layer 39 electrically connected to the light-emitting element 33 is exposed while the remaining part is shielded. Since the hot pressing needs to be performed when the light-emitting element 33 is transferred, in this embodiment, the third light-shielding layer 39 is disposed, which is beneficial for shielding the part of the third light-shielding layer 39 which is not electrically connected to the light-emitting element 33 to protect the circuit in the circuit layer 32 from being affected by the high-temperature environment, improve the product yield, protect the first circuit layer 32 from being scratched in the subsequent process, and prevent the first circuit layer 32 from being eroded by outside water vapors. In addition, since the third light-shielding layer 39 is located between the adjacent two light-emitting elements 33, crosstalk between light-emitting elements 33 emitting different colors can be reduced. Exemplarily, the material of the third light-shielding layer 39 may be, for example, black ink.

Figure 13:
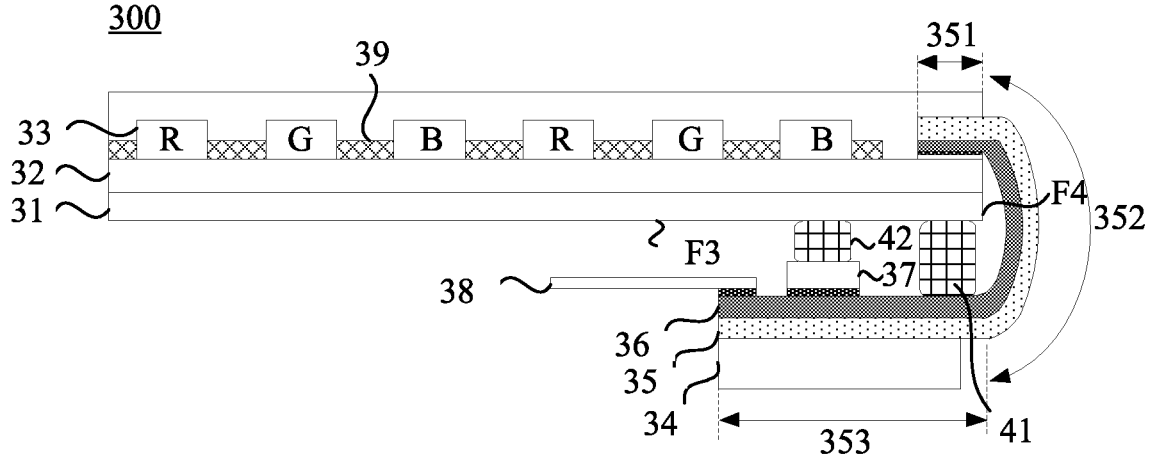
FIG. 13 is a structure diagram of another light-emitting panel according to an embodiment of the present disclosure.

FIG. 13 is a structure diagram of another light-emitting panel according to an embodiment of the present disclosure. Referring to FIG. 13, in one embodiment, the third rigid substrate 31 includes a second lower side F3 which is a surface of the third rigid substrate 31 facing away from the light-emitting element 33; and the light-emitting panel 300 further includes a third fixing adhesive 41 which adheres between the flexible substrate 35 of the epitaxial region 353 and the second lower side F3.

When the flexible substrate 35 in the epitaxial region 353 is bent to the side of the third rigid substrate 31 facing away from the light-emitting element 33, the flexible substrate 35 in the epitaxial region 353 may shake if not fixed, and affecting the stability of the structures such as the driver chip 37 and the second circuit layer 36. For example, the bonding connection between the second connection terminal 321 and the third connection terminal 361 may be broken. On the other hand, before being assembled with the housing structure or/and other optical control elements to form the display device, the light-emitting panel may need to undergo operations such as transportation or the like during which the flexible substrate 35 in the epitaxial region 353 may be broken. The third fixing adhesive 41 is disposed between the flexible substrate 35 of the epitaxial region 353 and the second lower side F3 and is used to bond the second lower side F3 and the second circuit layer 36, and preventing the large displacement of the structures such as the flexible substrate 35 of the epitaxial region 353 and the second circuit layer 36 and improving the product reliability.

Figure 14:
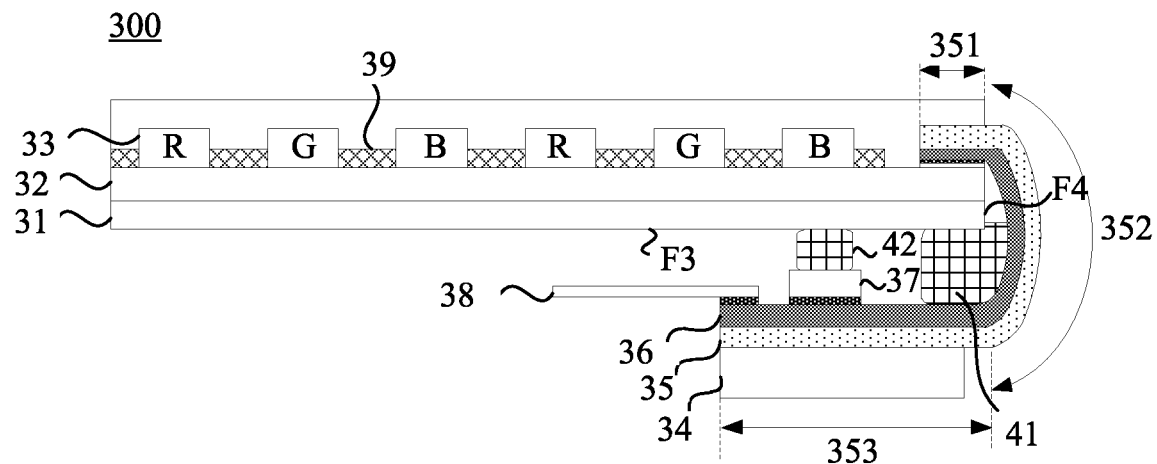
FIG. 14 is a structure diagram of another light-emitting panel according to an embodiment of the present disclosure.

FIG. 14 is a structure diagram of another light-emitting panel according to an embodiment of the present disclosure. Referring to FIG. 14, in one embodiment, the third rigid substrate 31 further includes a second side F4; the second side F4 is a surface connected to the second lower side F3 and faces towards the flexible substrate 35 of the epitaxial region 352; the elasticity of the third fixing adhesive 41 is higher than the elasticity of the third rigid substrate 31; and the third fixing adhesive 41 also covers the second side F4 and the connection point of the second side F4 and the second lower side F3.

Specifically, the elastic modulus of the third fixing adhesive 41 is lower than the elastic modulus of the third rigid substrate 31 and the rigidity or hardness of the third fixing adhesive 41 is lower than the rigidity or hardness of the third rigid substrate 31 and the elasticity of the third fixing adhesive 41 is higher than the elasticity of the third rigid substrate 31.

Referring to FIG. 14, the second side F4 of the third rigid substrate 31 and the second lower side F3 of the third rigid substrate 31 form an approximate right angle. Since the distance between the second circuit layer 36 of the bending region 352 and the third rigid substrate 31 is short, the right angle may cause damage to the second circuit layer 36. In this embodiment, the second side F4 of the third rigid substrate 31 and the connection point of the second side F4 and the second lower side F3 of the third rigid substrate 31 are covered by the third fixing adhesive 41 with higher elasticity and the second circuit layer 36 can be protected from being damaged by the third rigid substrate 31.

Referring to FIG. 13 or FIG. 14, in one embodiment, the third rigid substrate 31 includes the second lower side F3 which is the surface of the third rigid substrate 31 facing away from the light-emitting element 33. The light-emitting panel 300 further includes a fourth fixing adhesive 42 which adheres between the driver chip 37 and the second lower side F3.

When the flexible substrate 35 in the epitaxial region 353 is bent to the side of the third rigid substrate 31 facing away from the light-emitting element 33, the flexible substrate 35 in the epitaxial region 353 may shake if not fixed, and affecting the stability of the structures such as the driver chip 37 and the second circuit layer 36. In order to avoid such a situation, in this embodiment, the fourth fixing adhesive 42 is used to adhere to the driver chip 37 and the second lower side F3 of the third rigid substrate 31 to fix the driver chip 37, and improving the product reliability.

It is to be noted that FIG. 13 and FIG. 14 illustrate merely an example in which the light-emitting panel 300 includes the third fixing adhesive 41 and the fourth fixing adhesive 42. In other embodiments, the light-emitting panel may include merely the third fixing adhesive 41 or the fourth fixing adhesive 42, which is not limited by the embodiment of the present disclosure.

Figure 15:
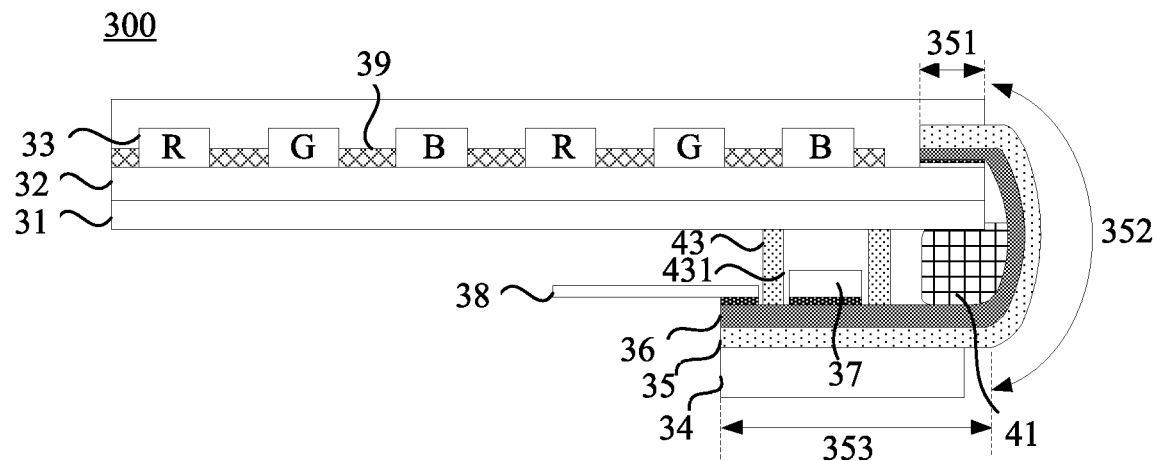
FIG. 15 is a structure diagram of another light-emitting panel according to an embodiment of the present disclosure.

FIG. 15 is a structure diagram of another light-emitting panel according to an embodiment of the present disclosure. Referring to FIG. 15, in one embodiment, the light-emitting panel 300 further includes a buffer layer 43 which is located between the third rigid substrate 31 and the flexible substrate 35 of the epitaxial region 353; and an opening 431 is disposed on the buffer layer 43 and the driver chip 37 is located in the opening 431.

In this embodiment, the buffer layer 43 is disposed between the third rigid substrate 31 and the flexible substrate 35 of the epitaxial region 353 and the stress which may occur between the driver chip 37 and the light-emitting element 33 can be buffered and any one of the light-emitting element 33 or the driver chip 37 can be prevented from being damaged due to the stress action. In one embodiment, the buffer layer 43 may be coated on the flexible substrate 35 of the epitaxial region 353 after the driver chip 37 and the fourth connection terminal 362 are bonded to each other. The material of the buffer layer 43 may be, for example, an organic material.

With continued reference to FIG. 15, in one embodiment, the height of the driver chip 37 is less than the depth of the opening 431 of the buffer layer 43 in the direction which is perpendicular to the plane where the third rigid substrate 31 is located.

In this manner, it is possible to avoid contact between the driver chip 37 and the buffer layer 43, and preventing the driver chip 37 from being subjected to the force of the buffer layer 43 and further improving the protection effect for the driver chip 37. It is to be noted that FIG. 15 illustrates merely an example in which the opening 431 runs through the buffer layer 43. In other embodiments, the opening 431 may not run through the buffer layer 43 as long as it is ensured that the height of the driver chip 37 is less than the depth of the opening 431 of the buffer layer 43.

Figure 16:
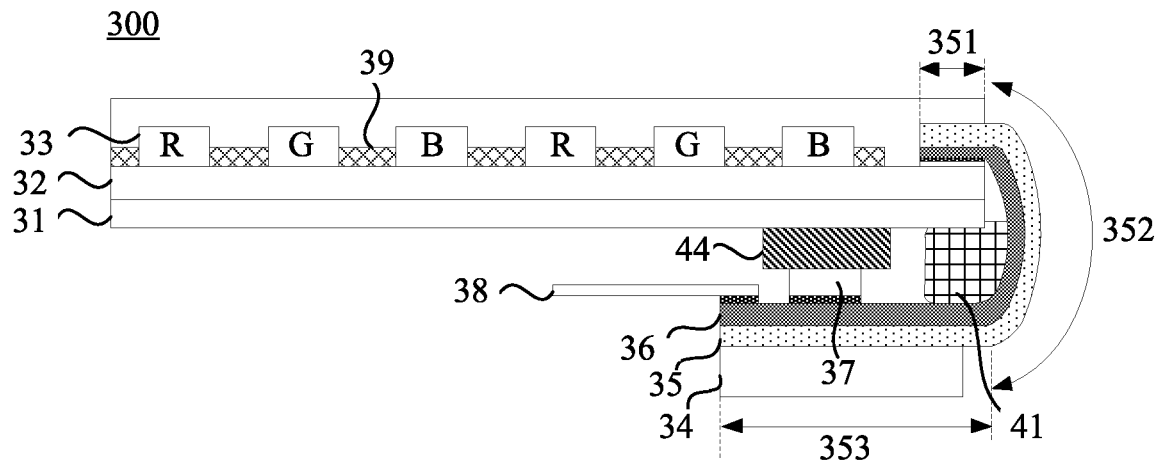
FIG. 16 is a structure diagram of another light-emitting panel according to an embodiment of the present disclosure.

FIG. 16 is a structure diagram of another light-emitting panel according to an embodiment of the present disclosure. Referring to FIG. 16, in one embodiment, the light-emitting panel 300 further includes a black foam 44 which is located between the third rigid substrate 31 and the flexible substrate 35 of the epitaxial region 353.

In this manner, the black foam 44 is enabled to be located between the light-emitting element 33 and the driver chip 37. Since the black foam 44 is made of a soft material and has high elasticity, the stress which may occur between the driver chip 37 and the light-emitting element 33 can be buffered and any one of the light-emitting element 33 or the driver chip 37 can be prevented from being damaged due to the stress action.

Figure 17:
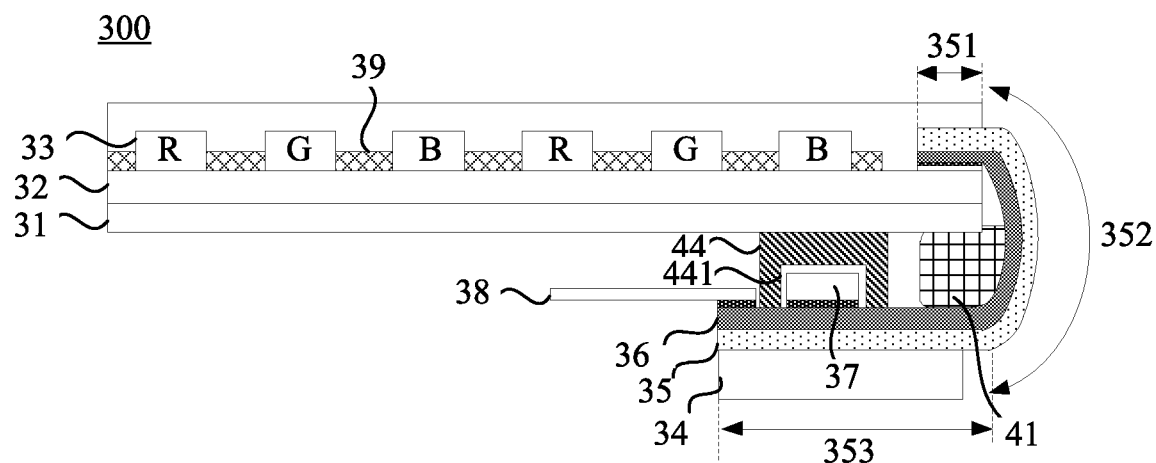
FIG. 17 is a structure diagram of another light-emitting panel according to an embodiment of the present disclosure.

FIG. 17 is a structure diagram of another light-emitting panel according to an embodiment of the present disclosure. Referring to FIG. 17, in one embodiment, the black foam 44 is provided with an opening 441 which faces toward the driver chip 37.

As shown in FIG. 17, the opening 441 is disposed on the black foam 44 and enabled to face towards the driver chip 37 and the driver chip 37 can be located in the opening 441 of the black foam 44, and improving the flatness of the internal structure of the light-emitting module.

With continued reference to FIG. 17, in one embodiment, the height of the driver chip 37 is less than the depth of the opening 441 of the black foam 44 in the direction which is perpendicular to the plane where the third rigid substrate 31 is located.

As mentioned above, in this manner, it is possible to avoid contact between the driver chip 37 and the black foam 44, and preventing the driver chip 37 from being subjected to the force of the black foam 44 and further improving the protection effect for the driver chip 37. It is to be noted that the opening 441 on the black foam 44 may or may not run through the black foam 44. FIG. 8 illustrates merely an example in which the opening 441 of the black foam 44 does not run through the black foam 44.

Figure 18:
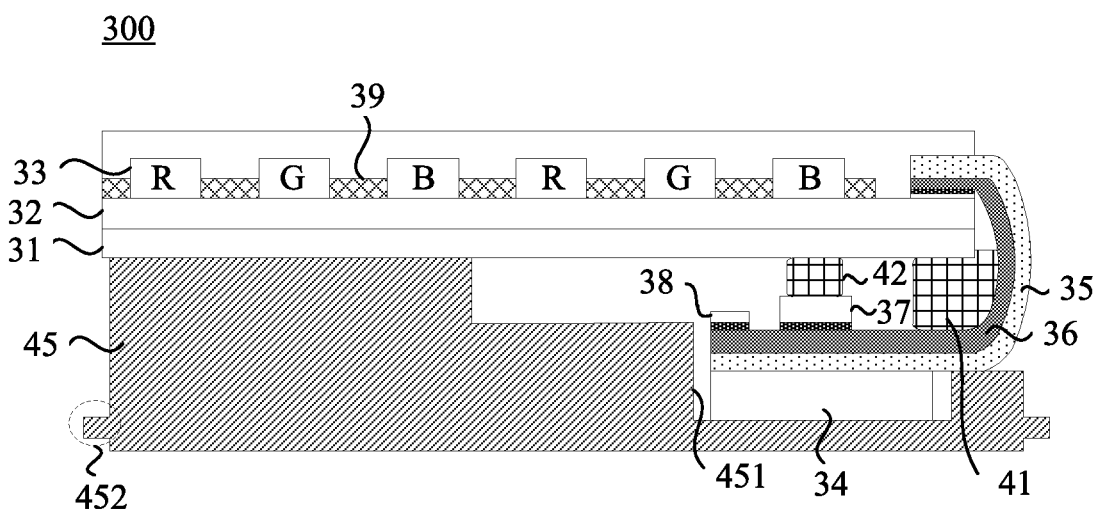
FIG. 18 is a structure diagram of another light-emitting panel according to an embodiment of the present disclosure.

FIG. 18 is a structure diagram of another light-emitting panel according to an embodiment of the present disclosure. Referring to FIG. 18, in one embodiment, the light-emitting panel 300 further includes a carrier board 45 which is located on a side of the fourth rigid substrate 34 facing away from the flexible substrate 35; and a slot 451 is disposed on the carrier board 45 and the fourth rigid substrate 34 is located in the slot 451.

The carrier board 45 is disposed on the side of the fourth rigid substrate 34 facing away from the flexible substrate 35 and is to carry the structures such as the light-emitting element 33 and the third rigid substrate 31 on which the light-emitting element 14 is located, the driver chip 37 and the fourth rigid substrate 34 on which the driver chip 15 is located, and the flexible circuit board 38. The carrier board 45 is provided with the slot 451 and the fourth rigid substrate 34 is located in the slot 451, which facilitates the light and thin design of the light-emitting panel. In addition, the carrier board 45 may be provided with a protrusion 452. When the light-emitting module is assembled into the housing of the display device, the protrusion 452 can be inserted into the engagement hole of the housing to fix the light-emitting module.

Figure 19:
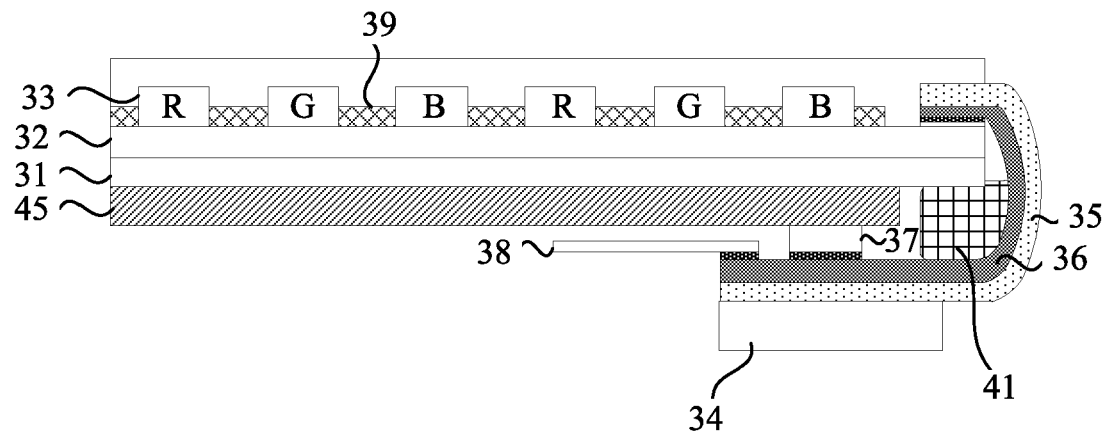
FIG. 19 is a structure diagram of another light-emitting panel according to an embodiment of the present disclosure.

The structure of the carrier board 45 in FIG. 18 is merely an example and not a limitation. Exemplarily, FIG. 19 is a structure diagram of another light-emitting panel according to an embodiment of the present disclosure. Referring to FIG. 19, in one embodiment, the light-emitting panel 300 further includes a carrier board 45 which is located between the third rigid substrate 31 and the driver chip 37. In addition, the driver chip 37 and the third rigid substrate 31 adhere onto two opposite sides of the carrier board 45.

In this embodiment, since a gap exists between the third rigid substrate 31 and the driver chip 37, the carrier board 45 is disposed in the gap and the driver chip 37 and the third rigid substrate 31 adhere to two opposite sides of the carrier board 45. In this manner, the structures such as the light-emitting element 33 and the third rigid substrate 31 on which the light-emitting element 33 is located, the driver chip 37 and the fourth rigid substrate 34 on which the driver chip 37 is located, and the flexible circuit board 38 also can be carried and fixed, and the light and thin design of the light-emitting panel is facilitated.

In summary, the above-mentioned embodiment describes in detail another structure of the light-emitting panel in the light-emitting module. For convenience of distinction, the light-emitting panels of two structures and the corresponding internal structures adopt different reference numerals. The light-emitting module may include at least one light-emitting panel (100/300) provided by any one of the above-mentioned embodiments. Based on the above description, the process for manufacturing the light-emitting module provided by the embodiments of the present disclosure is simple and the product yield can be improved.

Figure 20:
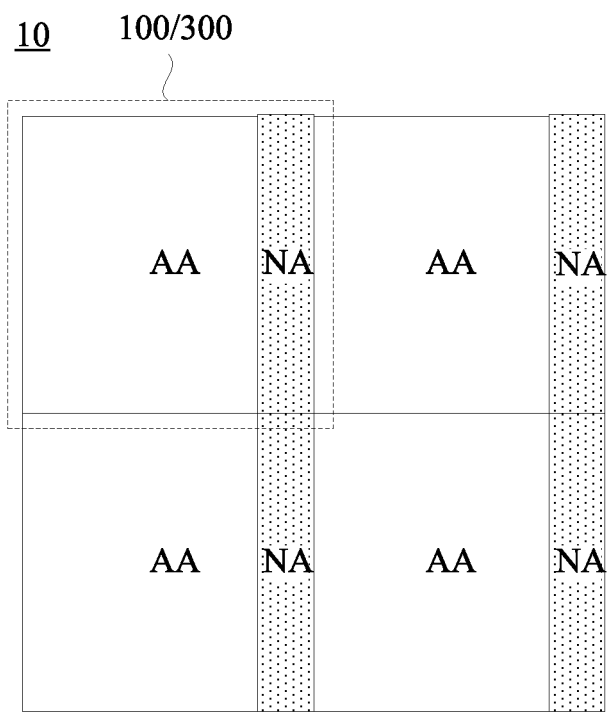
FIG. 20 is a top view of a light-emitting module according to an embodiment of the present disclosure.

FIG. 20 is a top view of a light-emitting module according to an embodiment of the present disclosure. Referring to FIG. 20, in one embodiment, the light-emitting module 10 includes light-emitting panels 100/300 which are arranged and spliced in an array.

The massive transfer technology is difficult. Additionally, the larger the size of the light-emitting module is, the more difficult the transfer is. The subsequent overhaul also becomes more difficult and the product yield is low. In this embodiment, small-sized light-emitting panels 100/300 are arranged and spliced in the array to form a large-sized light-emitting module 100/300. In this manner, the difficulty of transfer can be reduced, the small-sized light-emitting panels 100/300 can be overhauled before being spliced to screen qualified light-emitting panels 100/300, and the difficulty of overhaul is reduced.

With continued reference to FIG. 20, in one embodiment, the side on which the bending region is included by the light-emitting panel 100/300 is spliced with the side on which the bending region is not included by another light-emitting panel 100/300.

It is to be understood that a frame of a width exists on the side on which the bending region is included by the light-emitting panel. The frame may be, for example, a region on the side of the first rigid substrate 11 facing towards the bending region 122 and with the light-emitting element 14 not disposed as shown in FIG. 1. Alternatively, the frame may be a bonding region 351 as shown in FIG. 12. In brief, the frame is a non-display region. As shown in FIG. 20, the region where the non-display region NA is located indicates the side on which the bending region is included by the light-emitting panel. In this embodiment, the side on which the bending region is included by the light-emitting panel 100/300 is spliced with the side on which the bending region is not included by another light-emitting panel 100/300 and a splicing seam (a non-display region) between adjacent light-emitting panels 100/300 can be small and the display effect can be improved.

Of course, the splicing manner shown in FIG. 20 is not a limitation. In other embodiments, the side on which the bending region is not included by the light-emitting panel may be spliced with the side on which the bending region is not included by another light-emitting panel. Specifically, the splicing manner may be set according to the number of light-emitting panels in the light-emitting module.

Figure 21:
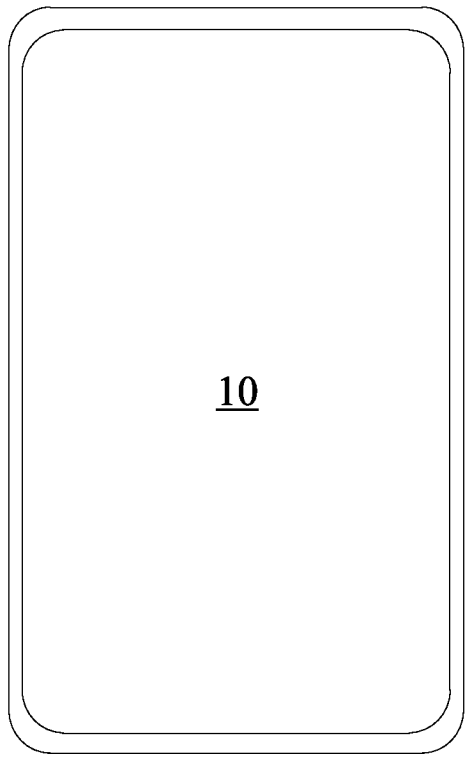
FIG. 21 is a structure diagram of a display device according to an embodiment of the present disclosure.

Based on the same inventive concept, the embodiment of the present disclosure further provides a display device. FIG. 21 is a structure diagram of a display device according to an embodiment of the present disclosure. Referring to FIG. 21, the display device 01 includes the light-emitting module 10 provided by any one of the above-mentioned embodiments. Therefore, the display device 01 has the same beneficial effect as the above-mentioned light-emitting module 10, for similarities, reference may be made to the description of the light-emitting module in the above-mentioned embodiment, and details are not repeated herein. The display device 01 provided by the embodiment of the present disclosure may be a mobile phone as shown in FIG. 21. The display device 01 may also be any electronic product with a display function, including but not limited to the following types: a television, a laptop, a desktop display, a tablet computer, a digital camera, a smart bracelet, smart glasses, a vehicle-mounted display, medical equipment, industrial control equipment, a touch interactive terminal, and the like, which is not particularly limited in the embodiment of the present disclosure.

Further, in the display device 01, the light-emitting module 10 may be directly used as a display module in the display device 01. The light-emitting module 10 is configured to include light-emitting elements emitting different colors such as a red light-emitting element R, a green light-emitting element G, and a blue light-emitting element B to achieve a color display.

Figure 22:
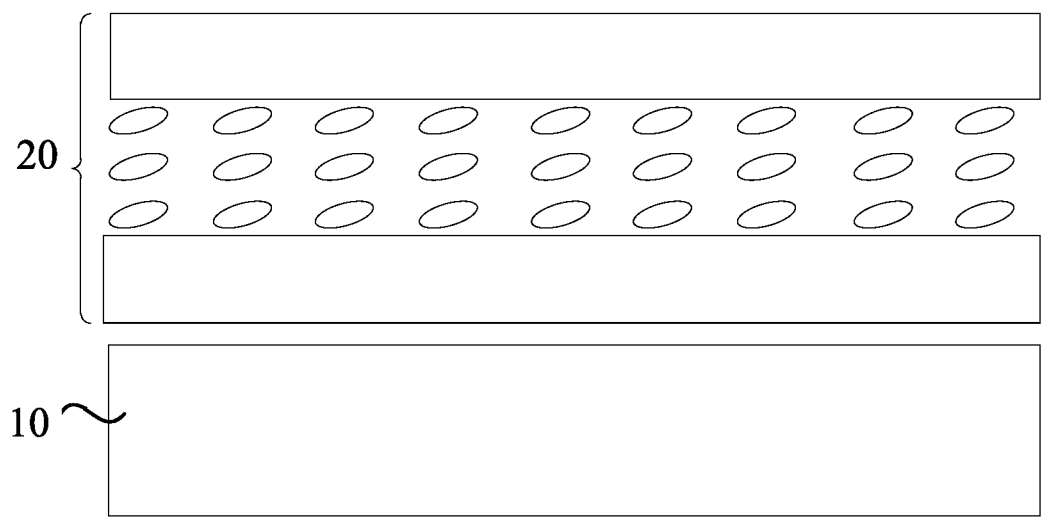
FIG. 22 is a structure diagram of another display device according to an embodiment of the present disclosure.

FIG. 22 is a structure diagram of another display device according to an embodiment of the present disclosure. Referring to FIG. 22, in one embodiment, the display device 01 further includes a light valve module 20 which is located on a light-emitting side of the light-emitting module 10.

In this embodiment, the light-emitting module 10 and the light valve module 20 together form a display module in the display device 01. The light-emitting module 10 is used as a backlight in the display module. The light valve module 20 is disposed on the light-emitting side of the light-emitting module 10 and used for adjusting the amount of light emitted by the backlight in each sub-pixel region. As shown in FIG. 22, in one embodiment, the light valve module 20 is a liquid crystal panel, and the specific structure of the light valve module 20 will not be described herein.

Further, in one embodiment, the light-emitting elements 14 in the light-emitting module 10 include the light-emitting elements emitting different colors such as a red light-emitting element R, a green light-emitting element G, and a blue light-emitting element B to improve the display effect. Alternatively, the light-emitting elements 14 in the light-emitting module 10 emit the same color, for example, white light. The light-filtering function of the color light-filtering layer in the liquid crystal panel is used to achieve the color display. In addition, the light-emitting elements 14 may each emit blue light and a color light-filtering layer is designed to be doped with quantum dots to achieve the color display. The configuration manner may be chosen according to actual needs, which is not limited in the embodiment of the present disclosure.

Next, the manufacturing method of the light-emitting module is described below by using the first light-emitting module as an example.

Figure 23:
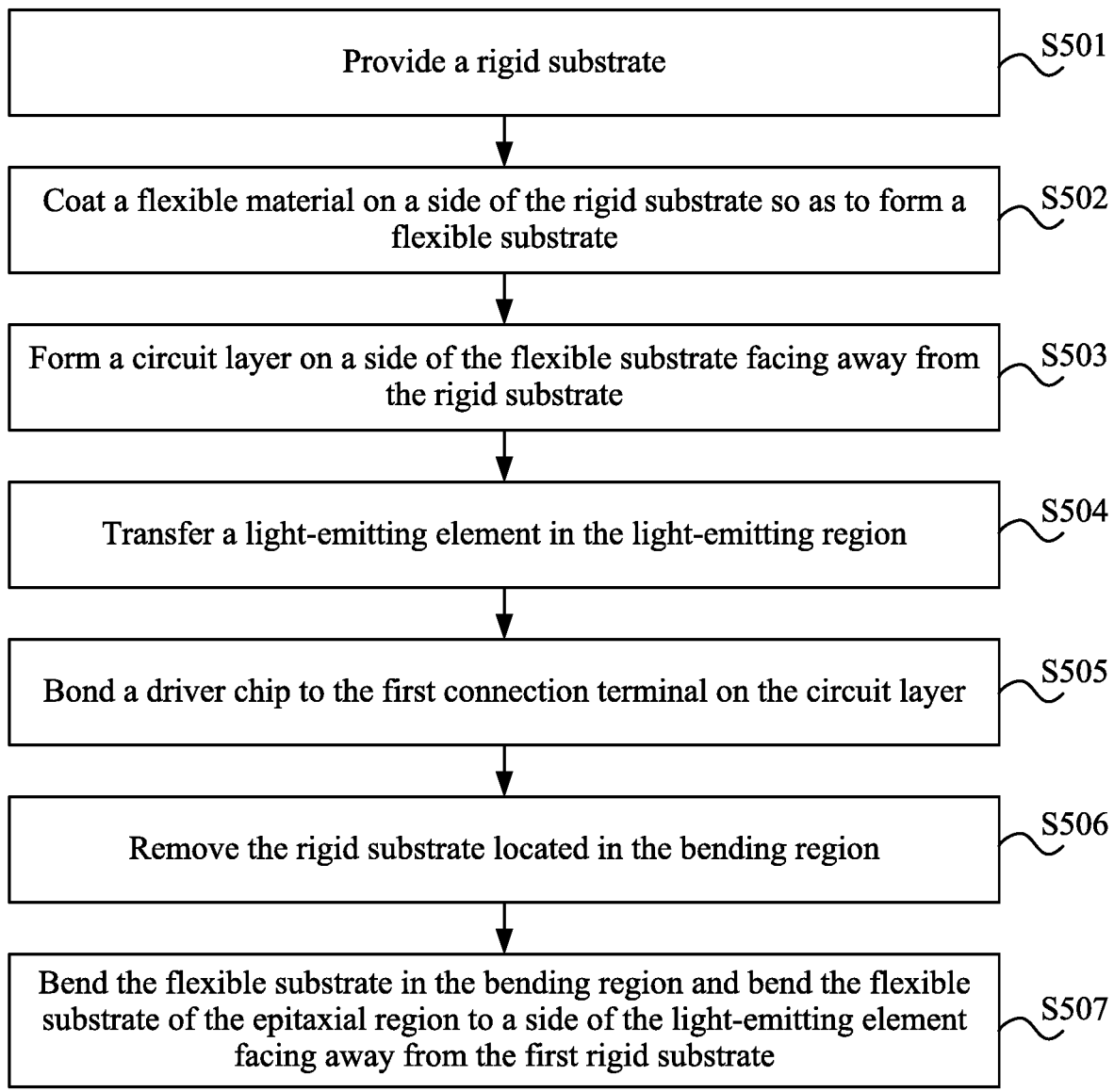
FIG. 23 is a flowchart of a manufacturing method of a light-emitting module according to an embodiment of the present disclosure.

FIG. 23 is a flowchart of a manufacturing method of a light-emitting module according to an embodiment of the present disclosure. Referring to FIG. 23, the manufacturing method of the light-emitting module may include steps described below.

In S501, a rigid substrate is provided.

Referring to FIG. 1, the rigid substrate may subsequently be used to form a first rigid substrate 11 and a second rigid substrate 16. For details, see S506.

In S502, a flexible material is coated on a side of the rigid substrate to form a flexible substrate.

Referring to FIG. 1, the flexible substrate 12 is formed on the side of the rigid substrate (such as the first rigid substrate 11 and the second rigid substrate 16). The flexible substrate 12 includes a light-emitting region 121, a bending region 122, and an epitaxial region 123, and the light-emitting region 121 and the epitaxial region 123 are located on two sides of the bending region 122 respectively.

In S503, a circuit layer is formed on a side of the flexible substrate facing away from the rigid substrate.

Referring to FIG. 1, the circuit layer 13 is formed on a side of the flexible substrate 12 facing away from the rigid substrate (such as the first rigid substrate 11 and the second rigid substrate 16). Specifically, the circuit layer 13 includes wires, a driver circuit located in the light-emitting region 121, and a first connection terminal 131 located in the epitaxial region.

In S504, a light-emitting element is transferred in the light-emitting region.

Referring to FIG. 1, the light-emitting element 14 is located in the light-emitting region 121. After the light-emitting element 14 is transferred to the light-emitting region 121, the light-emitting element 14 is electrically connected to the driver circuit of the circuit layer 13. Specifically, referring to FIG. 3, the circuit layer 13 includes the driver circuit which includes an anode 133 and a cathode 134. The light-emitting element 14 includes a first electrode 141 electrically connected to the anode 133 and a second electrode 142 electrically connected to the cathode 134.

In S505, a driver chip is bonded to the first connection terminal on the circuit layer.

Referring to FIG. 1, the driver chip 15 is bonded to the first connection terminal 131 on the circuit layer 13.

In S506, the rigid substrate located in the bending region is removed.

Referring to FIG. 1, after the rigid substrate in the bending region 122 is removed, the first rigid substrate 11 located in the light-emitting region and the second rigid substrate 16 located in the epitaxial region are reserved.

In S507, the flexible substrate is bent in the bending region and the flexible substrate in the epitaxial region is bent to a side of the light-emitting element facing away from the first rigid substrate.

Referring to FIG. 1, the flexible substrate 12 is bent and structures such as the circuit layer 13, the driver chip 15, the second rigid substrate 16, and the like are bent together to the side of the light-emitting element 14 facing away from the first rigid substrate 11.

According to the manufacturing method provided by the embodiment of the present disclosure, firstly, the flexible substrate, the circuit layer, the light-emitting element, and the driver chip are sequentially formed on one rigid substrate; then, the rigid substrate in the bending region is removed; and next, the flexible substrate is bent and the flexible substrate in the epitaxial region is bent to the side of the light-emitting element facing away from the first rigid substrate. Since the driver circuit, the wires, and the first connection terminal are each located in the circuit layer and the circuit layer can be bent together with the flexible substrate in this solution, electrical connection between the driver circuit to the driver chip can be implemented without complicated side wiring. The process is simpler and the product yield is can be improved.

Figure 24:
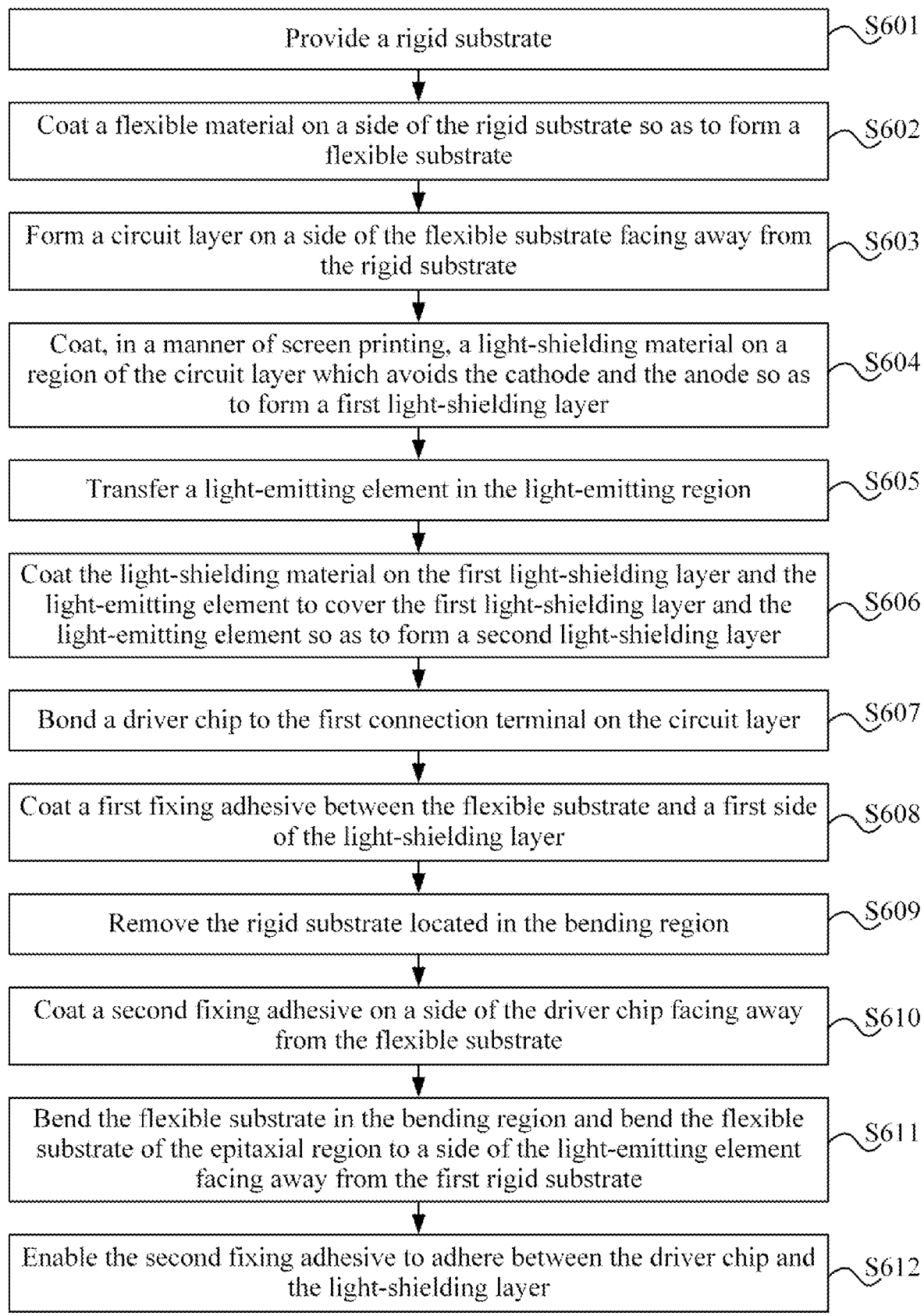
FIG. 24 is a flowchart of another manufacturing method of a light-emitting module according to an embodiment of the present disclosure.

An exemplary detailed description of the manufacturing method of the light-emitting module is provided below by using the light-emitting panel shown in FIG. 4 as an example. FIG. 24 is a flowchart of another manufacturing method of a light-emitting module according to an embodiment of the present disclosure. Correspondingly, FIGS. 25 to 35 are diagrams showing a process for manufacturing a light-emitting module according to an embodiment of the present disclosure. Referring to FIGS. 24 to 35, the manufacturing method of the light-emitting module includes the steps described below.

In S601, a rigid substrate is provided.

Figure 25:
FIGS. 25 to 35 are diagrams showing a process for manufacturing a light-emitting module according to an embodiment of the present disclosure.

Referring to FIG. 25, a rigid substrate 1 is provided. Exemplarily, the rigid substrate 1 may be a transparent substrate.

In S602, a flexible material is coated on a side of the rigid substrate to form a flexible substrate.

Figure 26:
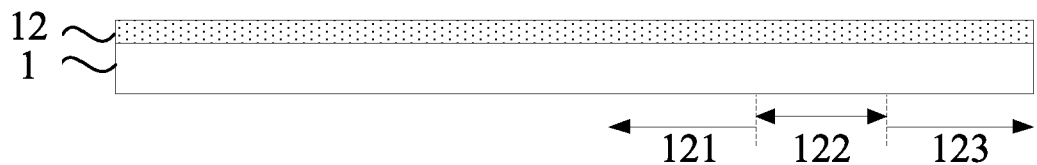

Referring to FIG. 26, the flexible substrate 12 is formed on the rigid substrate 1. The flexible substrate 12 includes a light-emitting region 121, a bending region 122, and an epitaxial region 123, and the light-emitting region 121 and the epitaxial region 123 are located on two sides of the bending region 122.

In S603, a circuit layer is formed on a side of the flexible substrate facing away from the rigid substrate.

Figure 27:
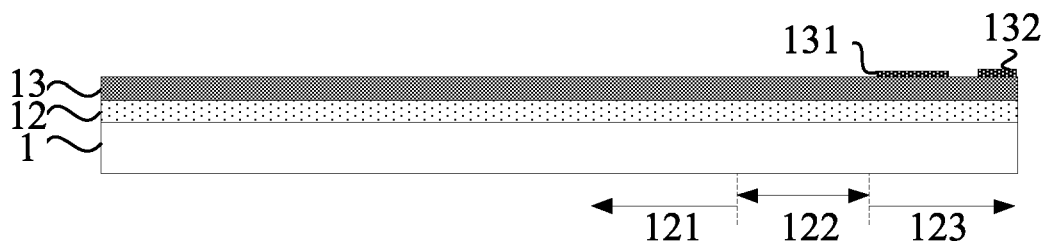

Referring to FIG. 27, the circuit layer 13 is formed on a side of the flexible substrate 12 facing away from the rigid substrate 11. The circuit layer 13 in the epitaxial region 123 includes a first connection terminal 131 and a fifth connection terminal 132. The circuit layer 13 in the light-emitting region 121 further includes a driver circuit. For the specific structure, refer to FIG. 3. As shown in FIG. 3, the circuit layer 13 includes the driver circuit which includes a anode 133 and an cathode 134. The anode 133 is used to be electrically connected to a first electrode 141 of the light-emitting element 14 while the cathode 134 is used to be electrically connected to a second electrode 142 of the light-emitting element 14.

In S604, a light-shielding material is coated, in a manner of screen printing, on a region of the circuit layer which avoids the cathode and the anode to form a first light-shielding layer.

Figure 28:
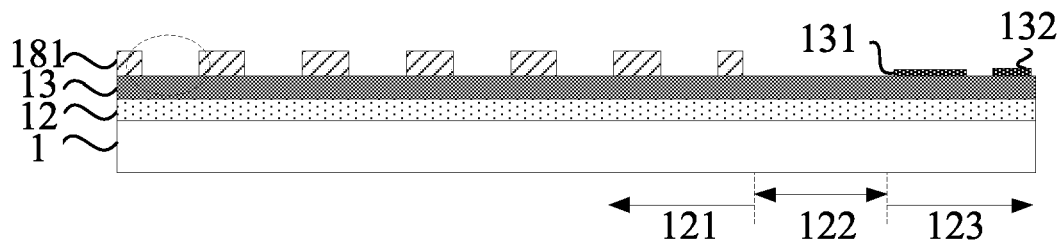

Referring to FIG. 28, the first light-shielding layer 181 is formed on the circuit layer 131 of the light-emitting region 121. The region indicated by the dotted ellipse is the region where the anode 133 and the cathode 134 are located. For the specific structure, refer to FIG. 3. As described above, the first light-shielding layer 181 may be used to protect the circuit layer 13 and prevent the crosstalk between the light-emitting elements 14 emitting different colors. Exemplarily, the material of the first light-shielding layer 181 may be black ink and the first light-shielding layer 181 may be formed in the manner of screen printing.

In S605, a light-emitting element is transferred in the light-emitting region.

Figure 29:
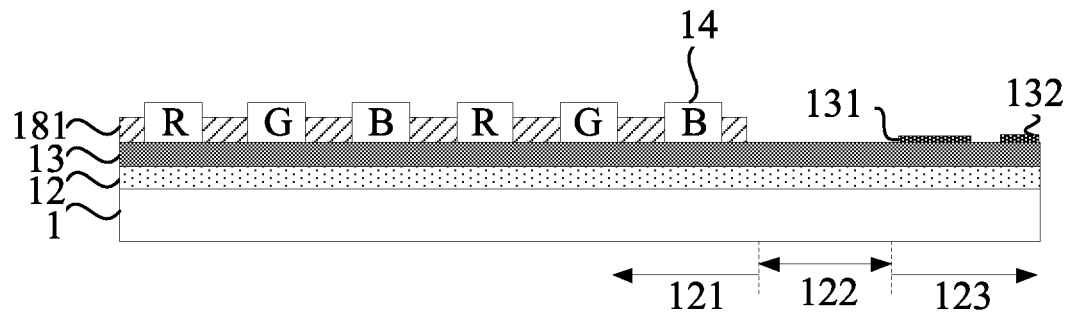

Referring to FIG. 29, the light-emitting element 14 is transferred to the light-emitting region 121; and the first light-shielding layer 181 is located between adjacent light-emitting elements 14.

In S606, the light-shielding material is coated on the first light-shielding layer and the light-emitting element to cover the first light-shielding layer and the light-emitting element to form a second light-shielding layer.

Figure 30:
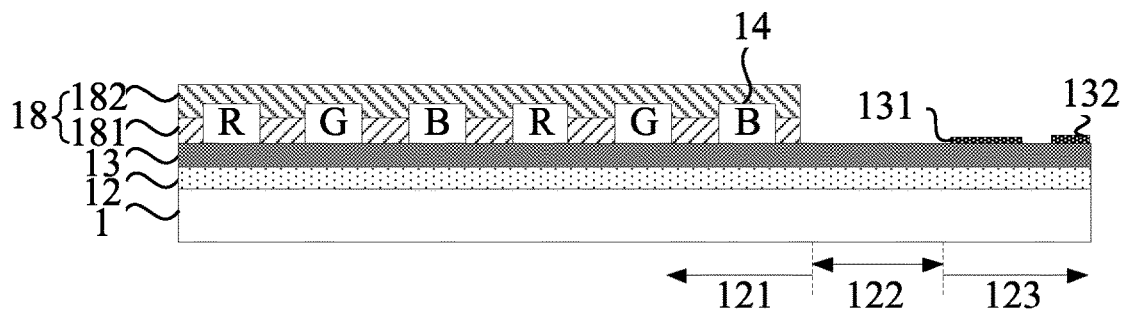

Referring to FIG. 30, the second light-shielding layer 182 covers the first light-shielding layer 181 and the light-emitting element 14 to prevent the crosstalk between the light-emitting elements 14 emitting different colors. Exemplarily, the material of the second light-shielding layer 182 may be a light-blocking adhesive and the second light-shielding layer 182 may be formed in a manner of coating.

In S607, a driver chip is bonded to the first connection terminal on the circuit layer.

Figure 31:
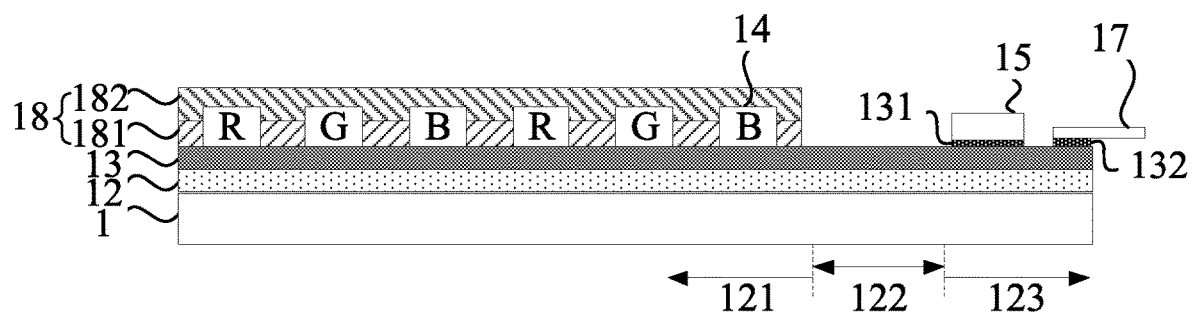

Referring to FIG. 31, the driver chip 15 is bonded to the first connection terminal 131 on the circuit layer 13. Then, a flexible circuit board 17 may be bonded to the fifth connection terminal 132 on the circuit layer 13.

In S608, a first fixing adhesive is coated between the flexible substrate and a first side of the light-shielding layer.

Figure 32:
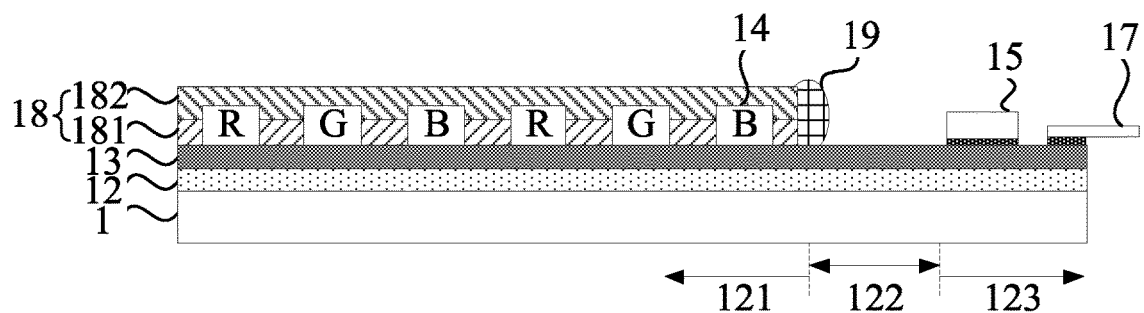

Referring to FIG. 32, the first light-shielding layer 181 and the second light-shielding layer 182 form the light-shielding layer 18. The light-shielding layer includes the first side which faces towards the driver chip 15. The first fixing adhesive 19 is coated between the flexible substrate 12 and the first side of the light-shielding layer 18. Thus, the light-shielding layer 18 can be pre-fixed and the light-emitting element 14 closer to the bending region 122 is prevented from being deformed by being pulled during the bending process. In addition, the first fixing adhesive 19 can also serve as a bending guide. For details, see the preceding description.

In S609, the rigid substrate located in the bending region is removed.

Figure 33:
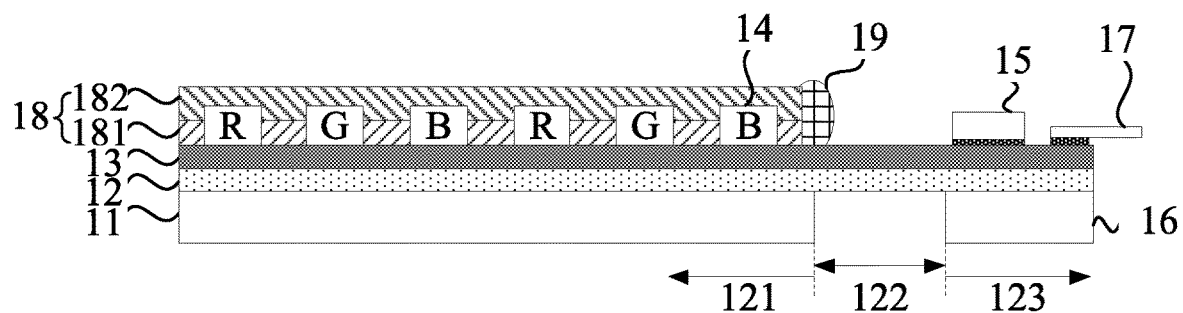

Referring to FIG. 33, after the rigid substrate in the bending region 122 is removed, the first rigid substrate 11 and the second rigid substrate 16 are reserved.

In S610, a second fixing adhesive is coated on a side of the driver chip facing away from the flexible substrate.

Figure 34:
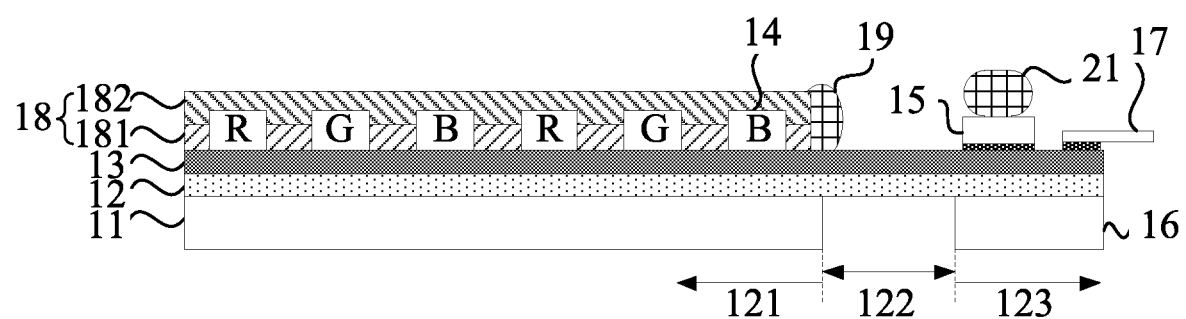

Referring to FIG. 34, the second fixing adhesive 21 is coated on the side of the driver chip 15 facing away from the flexible substrate 12. As described above, the second fixing adhesive 21 is used to fix the driver chip 15 after the flexible substrate 12 is bent. For details, see S611 and S612.

In S611, the flexible substrate is bent in the bending region and the flexible substrate in the epitaxial region is bent to a side of the light-emitting element facing away from the first rigid substrate.

In S612, the second fixing adhesive is enabled to adhere between the driver chip and the light-shielding layer.

Figure 35:
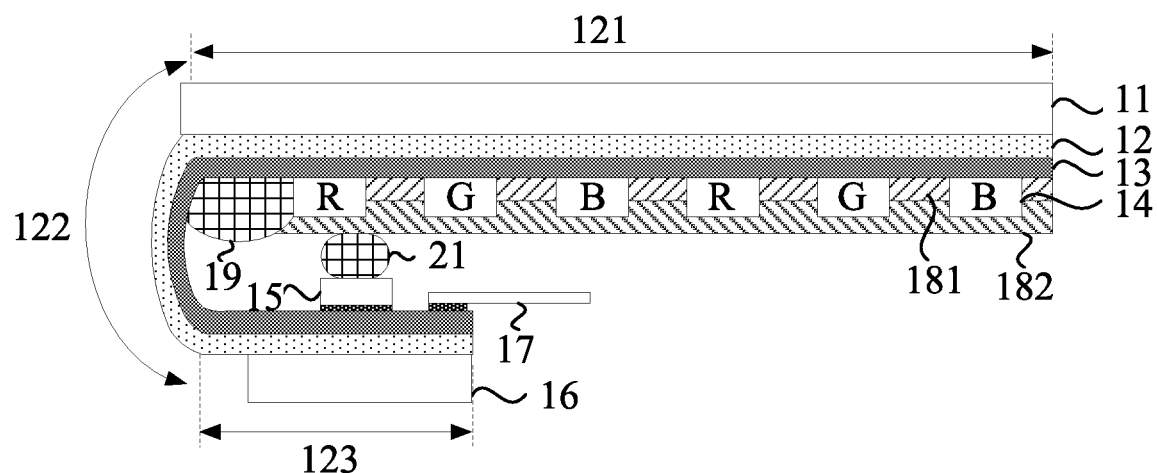

Referring to FIG. 35, the flexible substrate 12 in the bending region 122 is bent and the flexible substrate 12 in the epitaxial region 123 is bent to the side of the light-emitting element 14 facing away from the first rigid substrate 11. In addition, the driver chip 15 adheres to the lower side of the light-shielding layer 18 by the second fixing adhesive 21, and fixing the driver chip 15.

At this point, the light-emitting panel is manufactured. The light-emitting module may include at least one light-emitting panel. When the light-emitting module includes light-emitting panels, the plurality of light-emitting panels may be spliced to form a large-sized light-emitting module.

It is to be noted that, without affecting each other, a part of the steps in the above-mentioned manufacturing method may be changed in order. The above-mentioned process is merely an example and not a limitation. The light-emitting panels of other structures may be manufactured with reference to this process, and details are not repeated herein.

What is claimed is:

1. A light-emitting module, comprising at least one light-emitting panel, wherein each light-emitting panel of the at least one light-emitting panel comprises:
 a first rigid substrate is a transparent substrate and reused as a cover plate;
 a flexible substrate located on a side of the first rigid substrate and comprises a light-emitting region, a bending region, and an epitaxial region, wherein the bending region is connected between the lighting-emitting region and the epitaxial region;
a circuit layer located on a side of the flexible substrate facing away from the first rigid substrate and comprises a first connection terminal located on the epitaxial region;
a plurality of light-emitting elements located on a side of the circuit layer facing away from the first rigid substrate, and located on the light-emitting region, and are used to emit light toward the first rigid substrate; and
a driver chip bonded to the first connection terminal;
wherein the flexible substrate is bent in the bending region and the flexible substrate in the epitaxial region is bent to a side, and facing away from the first rigid substrate, of a plane where the plurality of light-emitting elements are located.

2. The light-emitting module according to claim 1, wherein each light-emitting panel further comprises a light-shielding layer, wherein the light-shielding layer comprises a first light-shielding layer, and the first light-shielding layer is located between two adjacent light-emitting elements of the plurality of light-emitting elements.

3. The light-emitting module according to claim 2, wherein
the light-shielding layer further comprises a second light-shielding layer located on a side of the first light-shielding layer facing away from the first rigid substrate; and
each of the plurality of light-emitting elements overlaps the second light-shielding layer.

4. The light-emitting module according to claim 2, wherein
the light-shielding layer comprises a first side and a first lower side, wherein the first lower side is a surface of the light-shielding layer facing away from the first rigid substrate, and the first side is a surface connected to the first lower side and faces towards the bending region of the flexible substrate; and
each light-emitting panel further comprises a first fixing adhesive which adheres between the light-emitting region of the flexible substrate and the first side of the light-shielding layer.

5. The light-emitting module according to claim 2, wherein
the light-shielding layer comprises a first lower side a surface of the light-shielding layer facing away from the first rigid substrate; and
each light-emitting panel further comprises a second fixing adhesive which adheres between the driver chip and the first lower side.

6. The light-emitting module according to claim 1, wherein each light-emitting panel further comprises a second rigid substrate located on a side, and facing away from the plurality of light-emitting elements, of the epitaxial region of the flexible substrate.

7. The light-emitting module according to claim 1, wherein each light-emitting panel further comprises a buffer layer located between the plurality of light-emitting elements and the epitaxial region of the flexible substrate; and
a first opening is disposed on the buffer layer, and the driver chip is located in the first opening.

8. The light-emitting module according to claim 1, wherein each light-emitting panel further comprises a black foam located between the plurality of light-emitting elements and the epitaxial region of the flexible substrate.

9. The light-emitting module according to claim 7, wherein each light-emitting panel further comprises a carrier board located on a side of a second rigid substrate facing away from the flexible substrate provided with a slot and the second rigid substrate is located in the slot.

10. The light-emitting module according to claim 3, wherein each light-emitting panel further comprises a carrier board located between the light-shielding layer and the driver chip, and the driver ship and the light-shielding layer adhere onto two opposite sides of the carrier board.

11. The light-emitting module according to claim 1, wherein
the epitaxial region further comprises a fifth connection terminal electrically connected to the driver chip; and
each light-emitting panel further comprises a flexible circuit board which is bonded to the fifth connection terminal.

12. The light-emitting module according to claim 1, wherein the plurality of light-emitting elements comprise a mini-light-emitting diode (mini-LED) or a micro-light-emitting diode (micro-LED).

13. A light-emitting module, comprising at least one light-emitting panel, wherein each light-emitting panel of the at least one light-emitting panel comprises:
a third rigid substrate;
a first circuit layer located on a side of the third rigid substrate and comprises a second connection terminal;
a plurality of light-emitting elements located on a side of the first circuit layer facing away from the third rigid substrate;
a fourth rigid substrate;
a flexible substrate located on a side of the fourth rigid substrate and comprises a bonding region, a bending region, and an epitaxial region;
a second circuit layer located on a side of the flexible substrate facing away from the fourth rigid substrate and comprises a third connection terminal located on the bonding region and a fourth connection terminal located on the epitaxial region, wherein the third connection terminal is bonded to the second connection terminal; and
a driver chip bonded to the fourth connection terminal;
wherein the flexible substrate is bent in the bending region and the flexible substrate in the epitaxial region is bent to a side of the third rigid substrate facing away from the plurality of light-emitting elements.

14. The light-emitting module according to claim 13, wherein each light-emitting panel further comprises a third light-shielding layer located between two adjacent light-emitting elements of the plurality of light-emitting elements.

15. The light-emitting module according to claim 13, wherein
the third rigid substrate comprises a second lower side a surface of the third rigid substrate facing away from the light-emitting element; and
each light-emitting panel further comprises a third fixing adhesive adheres between the epitaxial region of the flexible substrate and the second lower side.

16. The light-emitting module according to claim 13, wherein
the third rigid substrate comprises a second lower side a surface of the third rigid substrate facing away from the plurality of light-emitting elements; and
each light-emitting panel further comprises a fourth fixing adhesive adheres between the driver chip and the second lower side.

17. The light-emitting module according to claim 13, wherein
   each light-emitting panel further comprises a buffer layer located between the third rigid substrate and the epitaxial region of the flexible substrate; and
   a third opening is disposed on the buffer layer, and the driver chip is located in the third opening.

18. The light-emitting module according to claim 13, wherein each light-emitting panel further comprises a black foam located between the third rigid substrate and the epitaxial region of the flexible substrate.

19. The light-emitting module according to claim 13, wherein each light-emitting panel further comprises a carrier board located on a side of the fourth rigid substrate facing away from the flexible substrate and provided with a slot, and the fourth rigid substrate is located in the slot.

20. The light-emitting module according to claim 13, wherein each light-emitting panel further comprises a carrier board located between the third rigid substrate and the driver chip, and the driver ship and the third rigid substrate adhere onto two opposite sides of the carrier board.

\* \* \* \* \*